(12) United States Patent
Druffel et al.

(10) Patent No.: US 10,714,688 B2
(45) Date of Patent: Jul. 14, 2020

(54) METHODS FOR FORMING A PEROVSKITE SOLAR CELL

(71) Applicant: University of Louisville Research Foundation, Inc., Louisville, KY (US)

(72) Inventors: Thad Druffel, Louisville, KY (US); Brandon Lavery, Hamburg, NY (US); Krishnamraju Ankireddy, Louisville, KY (US); Amir Hossein Ghahremani, Louisville, KY (US); Blake Martin, Louisville, KY (US); Gautam Gupta, Prospect, KY (US)

(73) Assignee: UNIVERSITY OF LOUISVILLE RESEARCH FOUNDATION, INC., Louisville, KY (US)

( * ) Notice: Subject to any disclaimer, the term of this patent is extended or adjusted under 35 U.S.C. 154(b) by 0 days.

(21) Appl. No.: 16/165,448

(22) Filed: Oct. 19, 2018

(65) Prior Publication Data
US 2019/0051830 A1   Feb. 14, 2019

Related U.S. Application Data

(63) Continuation-in-part of application No. 15/443,766, filed on Feb. 27, 2017.
(Continued)

(51) Int. Cl.
*H01L 51/00* (2006.01)
*H01L 51/56* (2006.01)
*H01L 51/42* (2006.01)

(52) U.S. Cl.
CPC ...... *H01L 51/0026* (2013.01); *H01L 51/0003* (2013.01); *H01L 51/0027* (2013.01);
(Continued)

(58) Field of Classification Search
CPC ... H01L 51/5012; H01L 51/56; H01L 51/006; H01L 51/0056; H01L 51/0077
See application file for complete search history.

(56) References Cited

U.S. PATENT DOCUMENTS

| | | | | |
|---|---|---|---|---|
| 6,143,679 A * | 11/2000 | Nagasawa | ................. | C30B 9/00 501/134 |
| 2006/0024981 A1 * | 2/2006 | Nakamura | .......... | H01L 21/0237 438/795 |

(Continued)

FOREIGN PATENT DOCUMENTS

WO    2015/159192 A1    10/2015

OTHER PUBLICATIONS

Nanostructured Materials for Next-Generation Energy Storage and Conversion Hydrogen Production, Storage, and Utilization, Ying-Pin Chen, Sajid Bashir, Jingbo Louise Liu, Springer, May 31, 2017—Technology & Engineering, p. 29. (Year: 2017).*

(Continued)

*Primary Examiner* — Kyoung Lee
*Assistant Examiner* — Christina A Sylvia
(74) *Attorney, Agent, or Firm* — Wyatt, Tarrant & Combs, LLP; Max E. Bridges; Stephen C. Hall

(57) ABSTRACT

A perovskite thin film and method of forming a perovskite thin film are provided. The perovskite thin film includes a substrate, a hole blocking/electron transport layer, and a sintered perovskite layer. The method of forming the perovskite solar cell includes depositing a perovskite layer onto a substrate and processing (for example, by sintering) the perovskite layer with intense pulsed light to initiate a radiative thermal response that is enabled by an alkyl halide additive.

10 Claims, 21 Drawing Sheets

Related U.S. Application Data

(60) Provisional application No. 62/299,593, filed on Feb. 25, 2016.

(52) U.S. Cl.
CPC .......... *H01L 51/4226* (2013.01); *H01L 51/56* (2013.01); *H01L 51/005* (2013.01); *Y02E 10/549* (2013.01); *Y02P 70/521* (2015.11)

(56) References Cited

U.S. PATENT DOCUMENTS

| | | | |
|---|---|---|---|
| 2015/0249170 A1 | 9/2015 | Snaith et al. | |
| 2016/0254472 A1 | 9/2016 | Wang et al. | |
| 2017/0040121 A1* | 2/2017 | Satou | H01G 9/2013 |
| 2017/0148579 A1* | 5/2017 | Snaith | C23C 14/0021 |
| 2017/0221639 A1* | 8/2017 | Hayakawa | H01L 51/44 |
| 2017/0346031 A1* | 11/2017 | Lee | C09K 11/06 |

OTHER PUBLICATIONS

Xenon, "Photonic Curing R&D Sytem," Sinteron 2000 datasheet (Year: 2010).*
Williams, B. A., et al. 2016 Intense pulsed light annealing of copper zinc tin sulfide nanocrystal coatings Journal of Vacuum Science & Technology A 34 051204.
Nie, W., et al. 2015 High-efficiency solution-processed perovskite solar cells with millimeter-scale grains Science 347 522-5.
Stranks, S. D., et al. 2013 Electron-hole diffusion lengths exceeding 1 micrometer in an organometal trihalide perovskite absorber Science 342 341-4.
Luo, S., et al. 2016 Crystal Structure Formation of CH3NH3PbI3-xClx Perovskite Materials 9 123.
Jeon, N. J., et al. 2014 Solvent engineering for high-performance inorganic-organic hybrid perovskite solar cells Nature materials 13 897-903.
Jha, M., et al. 2015 Solution phase synthesis and intense pulsed light sintering and reduction of a copper oxide ink with an encapsulating nickel oxide barrier Nanotechnology 26 175601.
Baikie T, Fang Y, et al. 2013 Synthesis and crystal chemistry of the hybrid perovskite (CH 3 NH 3) PbI 3 for solid-state sensitised solar cell applications Journal of Materials Chemistry A 1 5628-41.
Kojima, A., et al. 2009 Organometal halide perovskites as visible-light sensitizers for photovoltaic cells Journal of the American Chemical Society 131 6050-1.
Maculan, G., et al. 2015 CH3NH3PbCl3 single crystals: inverse temperature crystallization and visible-blind UV-photodetector The journal of physical chemistry letters 6 3781-6.
Yantara, N., et al. 2015 Unravelling the effects of Cl addition in single step CH3NH3PbI3 perovskite solar cells Chemistry of Materials 27 2309-14.
Rosales, B. A., et al. 2016 Persistent dopants and phase segregation in organolead mixed-halide perovskites Chemistry of Materials 28 6848-59.
Kim, H.-S., et al. Lead Iodide Perovskite Sensitized All-Solid-State Submicron Thin Film Mesoscopic Solar Cell with Efficiency Exceeding 9%. Sci. Rep. 2012, 2, 591/1-591/7.
Noh, J. H., et al. Efficient Inorganic-Organic Hybrid Perovskite Solar Cells Based on Pyrene Arylamine Derivatives as Hole-Transporting Materials. J. Am. Chem. Soc. 2013, 135, 19087-19090.
Loi, M. A., et al. Hybrid Solar Cells—Perovskites Under the Sun. Nat. Mater. 2013, 12 (12), 1087-1089.
You, J., et al. Moisture Assisted Perovskite Film Growth for High Performance Solar Cells. Appl. Phys. Lett. 2014, 105 (18), 183902/1-183902/5.
Burschka, J., et al. Sequential Deposition as a Route to High-Performance Perovskite-Sensitized Solar Cells. Nature 2013, 499 (7458), 316-319.
Yantara, N., et al. Loading of Mesoporous Titania Films by CH3NH3PbI3 Perovskite, Single Step Vs. Sequential Deposition. Chem. Commun. 2015, 51 (22), 4603-4606.
Panthani, M. G., et al. High Efficiency Solution Processed Sintered CdTe Nanocrystal Solar Cells: The Role of Interfaces. Nano Lett. 2014, 14 (2), 670-675.
Song, Z. N., et al. Impact of Processing Temperature and Composition on the Formation of Methylammonium Lead Iodide Perovskites. Chem. of Mater. 2015, 27 (13), 4612-4619.
Eperon, G. E., et al. Morphological Control for High Performance, Solution-Processed Planar Heterojunction Perovskite Solar Cells. Adv. Func. Mater. 2014, 24 (1), 151-157.
Zhou, Y., et al. Room-Temperature Crystallization of Hybrid-Perovskite Thin Films Via Solvent-Solvent Extraction for High-Performance Solar Cells. J. Mater. Chem. A 2015, 3 (15), 8178-8184.
Ahn, N., et al. Highly Reproducible Perovskite Solar Cells with Average Efficiency of 18.3% and Best Efficiency of 19.7% Fabricated Via Lewis Base Adduct of Lead(Ii) Iodide. J. Am. Chem. Soc. 2015, 137 (27), 8696-8699.
Draper, G. L., et al. Fabrication of Elemental Copper by Intense Pulsed Light Processing of a Copper Nitrate Hydroxide Ink. ACS Appl. Mater. Interfaces 2015, 7 (30), p. 16478-16485.
Carter, M., et al. Photonic Curing for Sintering of Nano-Particulate Material. Adv. Powder Metall. Part. Mater. 2007, 9/68-9/75.
Park, S.-H., et al. Flash Light Sintering of Nickel Nanoparticles for Printed Electronics. Thin Solid Films 2014, 550, 575-581.
Perelaer, J., et al. Roll-to-Roll Compatible Sintering of Inkjet Printed Features by Photonic and Microwave Exposure. From Non-Conductive Ink to 40% Bulk Silver Conductivity in Less Than 15 Seconds. Adv. Mater. (Weinheim, Ger.) 2012, 24 (19), 2620-2625.
Stoumpos, C. C., et al. Semiconducting Tin and Lead Iodide Perovskites with Organic Cations: Phase Transitions, High Mobilities, and near-Infrared Photoluminescent Properties. Inorg. Chem. 2013, 52 (15), 9019-9038.
Liang, P. W., et al. Additive Enhanced Crystallization of Solution-Processed Perovskite for Highly Efficient Planar-Heterojunction Solar Cells. Adv. Mater. 2014, 26 (22), 3748-3754.
Salim, T., et al. Perovskite-Based Solar Cells: Impact of Morphology and Device Architecture on Device Performance. J. Mater. Chem. A 2015, 3 (17), 8943-8969.
Dualeh, A., et al. Effect of Annealing Temperature on Film Morphology of Organic-Inorganic Hybrid Pervoskite Solid-State Solar Cells. Adv. Func. Mater. 2014, 24 (21), 3250-3258.
Araki, T., et al. Salt Ink Formulation for Printed Electronics Using Photonic Sintering. Langmuir 2013, 29 (35), 11192-11197.
Cui, H.-W., et al. Fast Photonic Curing of Electrically Conductive Adhesives Fabricated from Vinyl Ester Resin and Silver Micro-Flakes for Printed Electronics. RSC Adv. 2014, 4 (31), 15914-15922.
Dharmadasa, R., et al. Intense Pulsed Light Treatment of Cadmium Telluride Nanoparticle-Based Thin Films. ACS Appl. Mater. Interfaces 2014, 6 (7), 5034-5040.
Singh, M., et al. Photonic Sintering of Thin Film Prepared by Dodecylamine Capped CuInxGa1-XSe2 Nanoparticles for Printed Photovoltaics. Thin Solid Films 2014, 565, 11-18.
Dhage, S. R., et al. Rapid Treatment of CIGS Particles by Intense Pulsed Light. J. Phys. Chem. Solids 2010, 71 (10), 1480-1483.
Dhage, S., et al. Cu(In,Ga)Se2 Thin Film Preparation from a Cu(In,Ga) Metallic Alloy and Se Nanoparticles by an Intense Pulsed Light Technique. J. Elec. Mater. 2011, 40 (2), 122-126.
Niu, G., et al. Review of Recent Progress in Chemical Stability of Perovskite Solar Cells. J. Mater. Chem. A 2015, 3 (17), 8970-8980.
Ito, S., et al. Effects of Surface Blocking Layer of Sb2S3 on Nanocrystalline TiO2 for CH3NH3PbI3 Perovskite Solar Cells. J. Phys. Chem. C 2014, 118 (30), 16995-17000.
Leyden, M. R., et al. Large Formamidinium Lead Trihalide Perovskite Solar Cells Using Chemical Vapor Deposition with High Reproducibility and Tunable Chlorine Concentrations. J. Mater. Chem. A 2015, 3 (31), 16097-16103.

(56) References Cited

OTHER PUBLICATIONS

Saliba, M., et al. Influence of Thermal Processing Protocol Upon the Crystallization and Photovoltaic Performance of Organic-Inorganic Lead Trihalide Perovskites. J. Phys. Chem. C 2014, 118 (30), 17171-17177.

Pisoni, A., et al. Ultra-Low Thermal Conductivity in Organic-Inorganic Hybrid Perovskite CH3NH3PbI3. J. Phys. Chem. Lett. 2014, 5 (14), 2488-2492.

Leijtens, T., et al. The Importance of Perovskite Pore Filling in Organometal Mixed Halide Sensitized TiO2-Based Solar Cells. J. Phys. Chem. Lett. 2014, 5 (7), 1096-1102.

Xie, Y., et al. Enhanced Performance of Perovskite CH3NH3PbI3 Solar Cell by Using CH3NH3I as Additive in Sequential Deposition. ACS Appl. Mater. Interfaces 2015, 7 (23), 12937-12942.

Nguyen, W. H., et al. Enhancing the Hole-Conductivity of Spiro-Ometad without Oxygen or Lithium Salts by Using Spiro(TFSI)2 in Perovskite and Dye-Sensitized Solar Cells. J. Amer. Chem. Soc. 2014, 136 (31), 10996-11001.

Jean, J., et al. 2015 Pathways for solar photovoltaics Energy Environ. Sci. 8 1200-19.

Park, N-G. 2015 Perovskite solar cells: an emerging photovoltaic technology Materials Today 18 65-72.

Yang, W. S., et al. 2015 High-performance photovoltaic perovskite layers fabricated through intramolecular exchange Science 348 1234-7.

Seo, J, et al. 2016 Rational Strategies for Efficient Perovskite Solar Cells Accounts of Chemical Research 49 562-72.

Hwang, I., et al. 2015 Enhancing Stability of Perovskite Solar Cells to Moisture by the Facile Hydrophobic Passivation ACS applied materials & interfaces 7 17330-6.

Gao, H., et al. 2015 Nucleation and Crystal Growth of Organic-Inorganic Lead Halide Perovskites under Different Relative Humidity ACS applied materials & interfaces 7 9110-7.

Eperon, G. E., et al. 2015 The importance of moisture in hybrid lead halide perovskite thin film fabrication ACS nano 9 9380-93.

Li, D., et al. 2016 Humidity-Induced Grain Boundaries in MAPbI3 Perovskite Films The Journal of Physical Chemistry C 120 6363-8.

Pan, J., et al. 2016 Room-Temperature, Hydrochloride-Assisted, One-Step Deposition for Highly Efficient and Air-Stable Perovskite Solar Cells Advanced Materials 28 8309-14.

Noh, J. H., et al. 2013 Chemical management for colorful, efficient, and stable inorganic-organic hybrid nanostructured solar cells Nano letters 13 1764-9.

Nagabhushana, G. P., et al. 2016 Direct calorimetric verification of thermodynamic instability of lead halide hybrid perovskites Proc Natl Acad Sci U S A 113 7717-21.

Ding, Y., et al. 2014 Surfactant enhanced surface coverage of CH3NH3PbI3-xClx perovskite for highly efficient mesoscopic solar cells Journal of Power Sources 272 351-5.

Lavery, B. W., et al. 2016 Intense Pulsed Light Sintering of CH3NH3PbI3 Solar Cells ACS applied materials & interfaces 8 8419-26.

Troughton, J., et al. 2016 Photonic flash-annealing of lead halide perovskite solar cells in 1 ms J. Mater. Chem. A 4 3471-6.

Chung, W. H., et al. 2013 In situ monitoring of a flash light sintering process using silver nano-ink for producing flexible electronics Nanotechnology 24 035202.

Dharmadasa, R., et al. 2015 Processing of CdTe thin films by intense pulsed light in the presence of CdCl2 Journal of Coatings Technology and Research 12 835-42.

Rebohle, L., et al. 2016 A review of thermal processing in the subsecond range: semiconductors and beyond Semiconductor Science and Technology 31 103001.

Ankireddy, et al.; Rapid thermal annealing of CH3NH3PbI3 perovskite thin films by intense pulse light with aid of diiodomethane additive; Journal; Royal Society of Chemistry; Journal of Materials Chemistry; 2018; pp. 9378-9383; 6.

Lavery, Brandon, et al.; Intense Pulsed Light Sintering of CH3NH3PbI3 Solar Cells; ACS Appl. Mater. Interfaces; 2016; 8; 8419-8426.

Druffel, Thad, et al.; Intense pulsed light processing for photovoltaic manufacturing; Solar Energy Materials and Solar Cells; 2018; 174; 359-369.

Chueh, Chu-Chen, et al.; The roles of alkyl halide additives in enhancing perovskite solar cell performance; Journal of Materials Chemistry A; J. Mater. Chem. A; 2015; 3; 9058-9062; Royal Society of Chemistry.

Liang, Zhurong, et al.; A large grain size perovskite thin film with a dense structure for planar heterojunction solar cells via spray deposition under ambient conditions; RSC Adv.; 2015; 5; 60562-60569.

Yang, Woon Seok, et al.; Iodide management in formamidinium-lead-halide-based perovskite layers for efficient solar cells; Science; 2017 (Jun. 23, 2017); 356; 1376-1379.

Huang, Aibin, et al.; Achieving High Current Density of Perovskite Solar Cells by Modulating the Dominated Facets of Room-Temperature DC Magnetron Sputtered TiO2 Electron Extraction Layer; ACS Appl. Mater. Interfaces; 2017; 9; 2016-2022.

Jiang, Qi, et al.; Enhanced electron extraction using SnO2 for high-effciency planar-structure HC(NH2)2PbI3-based perovskite solar cells; Nature Energy; 2016 (Nov. 14, 2016); vol. 2; Article 16177; pp. 1-7.

Huang, Xiaoqing, et al.; High-performance transition metal-doped Pt3Ni octahedra for oxygen reduction reaction; Science; sciencemag.org; Jun. 12, 2015; Issue 6240; vol. 348; pp. 1230-1234.

Singh, Trilok, et al.; Sulfate-Assisted Interfacial Engineering for High Yield and Efficiency of Triple Cation Perovskite Solar Cells with Alkali-Doped TiO2 Electron-Transporting Layers; Adv. Funct. Mater.; 2018; 28; 1706287 (pp. 1-10).

Liang, Po-Wei, et al.; Additive Enhanced Crystallization of Solution-Processed Perovskite for Highly Effi cient Planar-Heterojunction Solar Cells; Adv. Mater.; 2014; 26; 3748-3754.

Tarnovsky, Alexander N.; Photodissociation dynamics of diiodomethane in solution; Chemical Physics Letters 312; (1999) Oct. 22, 1999; 121-130.

Abdi-Jalebi, Mojtaba, et al.; Maximizing and stabilizing luminescence from halide perovskites with potassium passivation; Nature; Mar. 22, 2018; vol. 555; 497-501.

Troughton, Joel, et al.; Photonic flash-annealing of lead halide perovskite solar cells in 1 ms; J. Mater. Chem. A; 2016; 4; 3471-3476.

* cited by examiner

METHODS FOR FORMING A PEROVSKITE SOLAR CELL

RELATED APPLICATIONS

This application is a continuation-in-part application of, and claims all benefits and priority available from, U.S. Nonprovisional patent application Ser. No. 15/443,766, filed on Feb. 27, 2017, which claims the benefit of U.S. Provisional Patent Application No. 62/299,593, filed Feb. 25, 2016, the teachings and entire disclosure of both are fully incorporated herein by reference.

TECHNICAL FIELD

The presently-disclosed subject matter generally relates to methods for forming a perovskite solar cell. In particular, certain embodiments of the presently-disclosed subject matter relate to methods for forming a perovskite solar cell that make use of intense pulsed light to sinter a perovskite layer.

BACKGROUND

There have been several innovations established in the last few years across all of the solar cell technologies that are geared towards reducing the cost of implementation of solar energy. These include newer architectures with higher efficiencies, refined material usage, lower cost materials, improved durability and higher throughputs. Much more rapid declines in the costs of solar power will in all likelihood require flexible modules that are not addressable using the market dominant crystalline silicon materials.

The perovskite solar cell is a relatively newer entrant into the solar photovoltaic technologies and has seen vast improvement in the power conversion efficiencies in a very short period of time. In particular, since the first report of perovskite solar cells in 2012, the technology has evolved to over 20% certified power-conversion efficiency. The cells are based on organometal halide perovskite materials characterized by high extinction coefficients and carrier mobilities. The perovskite structure is generally represented by the formula $ABX_3$ and in the case of the organometal halide the A site refers to an organic group, B represents a metal such as lead (Pb), and X is a halide group such as iodine (I), chlorine (Cl), or bromine (Br).

Perovskite solar cells provide ease of manufacturing, use of common materials, and respectable efficiencies. More specifically, these solar cells combine the crystallinity and high charge-transfer found in inorganic semiconductors with the cost-effective low-temperature solvent-based manufacturing of organic solar cells. Additionally, unlike traditional semiconductor solar cells, the perovskite solar cell is amenable to changes in the atoms of its crystal structure. This opens up many possibilities in tuning band gaps, using different cell configurations, and experimenting in processing techniques.

Although there are many different variations in perovskite solar cell technology, the fundamental concepts of semiconductors devices apply to them all. Larger crystal sizes lead to fewer grain boundaries and enhanced charge-transfer with longer charge-carrier diffusion lengths. Grain boundaries have been known to introduce allowed energy levels in the band gap of a semiconductor and act as recombination centers. In other semiconductor technologies, the grain size can be increased by sintering the semiconductor at high temperatures.

However, because of the instability of the methylammonium lead iodide ($CH_3NH_3PbI_3$) perovskite structure, annealing of perovskite materials is limited to temperatures <150° C. Above this temperature, the methylammonium iodide (MAI) begins to evaporate from the cell and the $CH_3NH_3PbI_3$ decomposes into lead iodide ($PbI_2$) and MAI. Additionally, when annealing at high temperatures, surface coverage is often reduced, resulting in the formation of perovskite islands due to agglomeration. More specifically, it has been demonstrated that as the annealing temperature increases, the number of pores in the final film decreases, but the size of the pores increases and the morphology transitions from a continuous layer into discrete islands of perovskite. An active layer morphology composed of discrete islands can create multiple shunting pathways by exposing the underlying contact and thus limiting performance. For at least these reasons, to date, the sintering techniques of other semiconductor technologies have not been explored as a viable alternative for the recrystallization of the unstable $CH_3NH_3PbI_3$ material in connection with perovskite formation.

Other methods for creating larger perovskite crystals and improving the surface coverage of perovskite films is therefore important for optimizing device performance and has been a topic of discussion in perovskite solar cell research. Initially researchers improved the crystal formation utilizing a two-step sequential deposition of $PbI_2$ followed by MAI. Others improved on that method by showing that heating the substrates prior to spin coating the $PbI_2$ solution resulted in better surface coverage and pore filling of the perovskite formed after dipping the films in MAI solution. However, this two-step method ($PbI_2$ spin coating followed by a MAI dip coat) is not ideal for roll-to-roll manufacturing. A more expedient one-step deposition of $CH_3NH_3PbI_3$ has also recently been advanced by using solvent-solvent extraction techniques. These techniques utilize low boiling point solvents such as diethyl ether to remove high boiling point solvents such as Dimethyl sulfoxide (DMSO) or Dimethylformamide (DMF) from the perovskite films after spin coating. While these advances are significant in improving the morphology of perovskite thin films and device performance, they are difficult to scale.

In addition to the morphology issues, the $CH_3NH_3PbI_3$ material of the perovskite solar cells can be susceptible to degradation from humidity, UV, and temperature. While a simple solution would be to hermetically seal the device, the same degradation mechanisms also limit the production of the perovskite layer to well controlled environs. As such, hermetically sealing the device does not solve the problem of manufacturing in ambient environments. Furthermore, the added sealing technologies and processing limitations add costs to the $CH_3NH_3PbI_3$ perovskite solar cell that can offset the opportunities of these low priced materials.

Notwithstanding the issues discussed above, recently, there has been increasing interest among the research community in depositing perovskite films under ambient conditions. For example, some researchers have demonstrated that the film deposition under low humidity conditions and post-treatment of the films under high humidity conditions yields better crystallinity and performance. Others have investigated the role of moisture exposure during the perovskite film fabrication. Their results conclude that the moisture exposure enhanced the open-circuit voltage. Further researchers have studied the humidity induced grain boundaries in perovskite films where prolonged exposure of the film to high humidity conditions created additional grain boundaries. More recently, air stable and high efficiency perovskite cells with dissolving HCl gas in MAI, $PbI_2$ and DMF solution were reported. Even though the perovskite film was formed with overnight drying at room temperature, the fabrication process was carried out in a nitrogen filled glove box over a prolonged time for drying, which likely is not a viable option for cost-effective large scale manufacturing.

To date, the role of alkyl halides in the crystal formation, solvent and solute interaction, and influence on film surface morphology has not been explored with photonic annealing techniques (such as intense pulsed light (IPL)). IPL heats a thin film using light energy, but the wavelengths span from the UV to the visible (vis) into the near infrared (NIR) and the duration of the pulse is on the order of a millisecond.

Accordingly, a heat treatment technique that can create a dense layer of perovskite particles with enlarged crystal sizes, and particularly a heat treatment technique for the production of perovskite films under ambient conditions, would be both highly desirable and beneficial. Likewise, a single-step perovskite deposition process under low humidity conditions would also be desirable.

SUMMARY

The presently-disclosed subject matter meets some or all of the above-identified needs, as will become evident to those of ordinary skill in the art after a study of information provided in this document.

This summary describes several embodiments of the presently-disclosed subject matter, and in many cases lists variations and permutations of these embodiments. This summary is merely exemplary of the numerous and varied embodiments. Mention of one or more representative features of a given embodiment is likewise exemplary. Such an embodiment can typically exist with or without the feature(s) mentioned; likewise, those features can be applied to other embodiments of the presently-disclosed subject matter, whether listed in this summary or not. To avoid excessive repetition, this summary does not list or suggest all possible combinations of such features.

In some embodiments, the presently-disclosed subject matter includes a method of forming a perovskite thin film, the method including depositing a perovskite layer onto a substrate and sintering the perovskite layer with intense pulsed light. In one embodiment, the substrate is a transparent substrate having a transparent conductive coating formed thereon. In another embodiment, the method comprises applying hole blocking/electron transport layer to the substrate prior to depositing the perovskite layer. In certain embodiments, the hole blocking/electron transport layer has a thickness of between about 40 nm and about 60 nm. In a further embodiment, the method comprises applying a mesoporous layer between the hole blocking/electron transport layer and the perovskite layer. In certain embodiments, the mesoporous layer has a thickness of between about 200 nm and about 300 nm. In some embodiments, the method further comprises applying a hole transport/electron blocking layer to the substrate prior to applying the perovskite layer.

In some embodiments, the perovskite layer is an organometallic halide having the formula $ABX_3$, wherein A represents an organic group, B represents a metal, and X represents at least one halide. In one embodiment, the organic group is selected from the group consisting of formamidinium, methylammonium, butylammonium, and a combination thereof; the metal is selected from the group consisting of lead, tin, and a combination thereof; and the halide is selected from the group consisting of chloride, iodide, bromide, and a combination thereof. In another embodiment, the step of depositing the perovskite layer comprises applying lead iodide to the substrate and depositing methylammonium iodide onto the lead iodide. In some embodiments, the perovskite layer comprises a mixed halide perovskite. In one embodiment, the mixed halide perovskite is formed from a perovskite precursor composition including $PbI_2$, MACl, and a light sensitive alkyl halide, such as diiodomethane ($CH_2I_2$). In another embodiment, the mixed halide perovskite is formed from a perovskite precursor combination including any combination of $PbI_2$, $Pb(Ac)_2$, MAI and MACl, and the light sensitive alkyl halide. The term "light sensitive" refers to the responsive of the chemical to light energy, specifically the ability to cleave chemical bonds using relatively small amounts of light energy. According to present embodiments, the interaction between $CH_2I_2$ and IPL enhances the overall performance of the solar cell through improved surface coverage and charge carrier dynamics. This IPL technique which utilizes an alkyl halide additive in the precursor chemistry, has the potential to anneal perovskite material at speeds of several square meters per second in ambient conditions. In another embodiment, forming the mixed halide perovskite comprises a one-step deposition method.

In one embodiment, the intense pulsed light has an energy of about 1000 J/pulse to about 2000 J/pulse. In another embodiment, the step of sintering the perovskite layer with intense pulsed light comprises applying one or more pulses of intense light. In another embodiment, the intense pulsed light has an energy from about an energy density of $1 \text{ J cm}^{-2}$ to about $35 \text{ J cm}^{-2}$. In this embodiment, the energy density unit is independent of the area. In another embodiment, the energy density is about $25 \text{ J cm}^{-2}$ per flash. In a further embodiment, each pulse lasts for about 1 microsecond to about 5 milliseconds.

The presently-disclosed subject matter also includes a method of forming a perovskite electronic device. In one embodiment, the method of forming the perovskite electronic device comprises depositing a hole blocking/electron transport layer over a substrate, forming a perovskite layer over the hole blocking/electron transport layer, and sintering the perovskite layer with intense pulsed light. In another embodiment, the method of forming the perovskite electronic device comprises depositing an electron blocking/hole transport layer over a substrate, forming a perovskite layer over the electron blocking/hole transport layer, and sintering the perovskite layer with intense pulsed light. In some embodiments, the perovskite electronic device includes a solar cell or a light emitting diode.

The presently-disclosed subject matter further includes an electronic device produced according to a method of forming a perovskite solar cell comprising depositing a perovskite layer onto a substrate and sintering the perovskite layer with intense pulsed light. In some embodiments, the electronic device includes a solar cell or a light emitting diode.

Further features and advantages of the presently-disclosed subject matter will become evident to those of ordinary skill in the art after a study of the description, figures, and non-limiting examples in this document.

BRIEF DESCRIPTION OF THE DRAWINGS

(FIG. 8A) S1 and S4 are hot-cast deposited films with non-PVP and PVP inclusion, respectively; S2 and S5 are hot plate cured perovskite films with non-PVP and PVP inclusion, respectively; and S3 and S6 are IPL treated perovskite films with non-PVP and PVP inclusion, respectively. (FIG. 8B) The corresponding scanning electron microscope (SEM) images for the films S1 through S6.

(FIG. 11A) No-PVP added films treated with 5 pulses. (FIG. 11B) No-PVP added films treated with 20 pulses. (FIG. 11C) PVP added films treated with 5 pulses. (FIG. 11D) PVP added films treated with 20 pulses.

DESCRIPTION OF EXEMPLARY EMBODIMENTS

Figure 1:
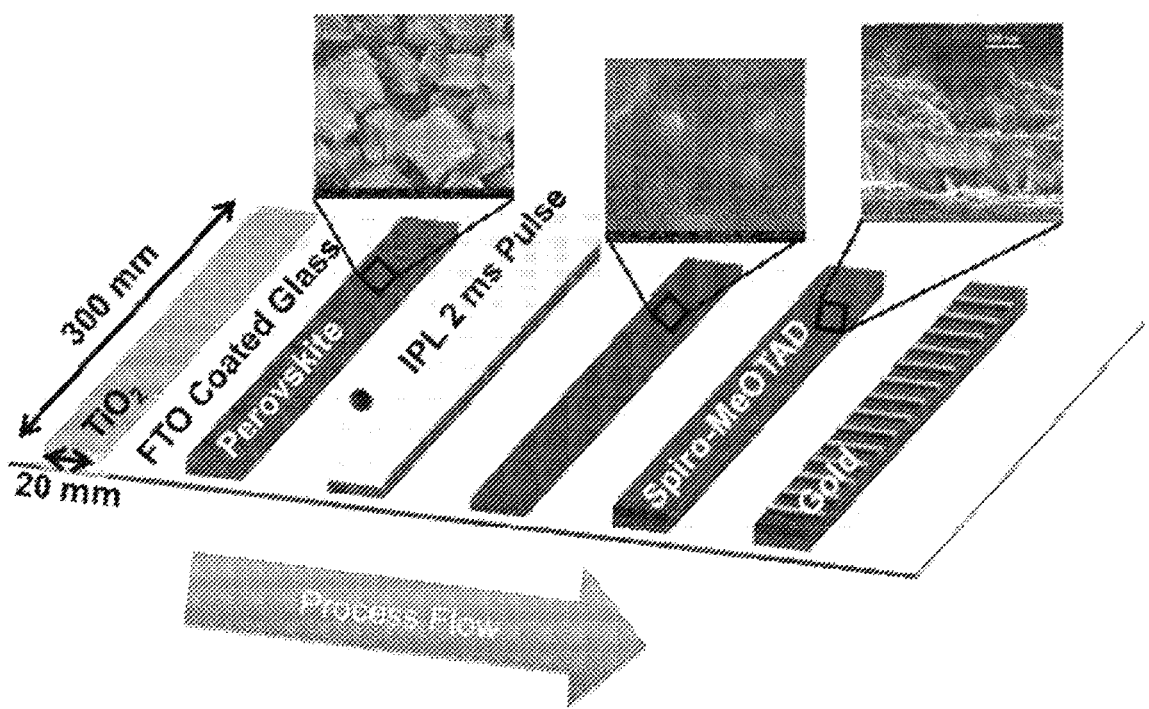
FIG. 1 shows a schematic illustrating scale-up for a perovskite electronic device based on roll-to-roll processing detailing each part of production; the as-deposited perovskite, the sintered perovskite, and a cross section of the completed device. The IPL sintering mechanism is deployed to create a faster continuous assembly line.

The details of one or more embodiments of the presently-disclosed subject matter are set forth in this document. Modifications to embodiments described in this document, and other embodiments, will be evident to those of ordinary skill in the art after a study of the information provided in this document. The information provided in this document, and particularly the specific details of the described exemplary embodiments, is provided primarily for clearness of understanding and no unnecessary limitations are to be understood therefrom. In case of conflict, the specification of this document, including definitions, will control.

While the terms used herein are believed to be well understood by those of ordinary skill in the art, certain definitions are set forth to facilitate explanation of the presently-disclosed subject matter.

Unless defined otherwise, all technical and scientific terms used herein have the same meaning as is commonly understood by one of skill in the art to which the invention(s) belong.

All patents, patent applications, published applications and publications, databases, websites and other published materials referred to throughout the entire disclosure herein, unless noted otherwise, are incorporated by reference in their entirety.

Where reference is made to a URL or other such identifier or address, it understood that such identifiers can change and particular information on the internet can come and go, but equivalent information can be found by searching the internet. Reference thereto evidences the availability and public dissemination of such information.

Although any methods, devices, and materials similar or equivalent to those described herein can be used in the practice or testing of the presently-disclosed subject matter, representative methods, devices, and materials are described herein.

The present application can "comprise" (open ended) or "consist essentially of" the components of the present invention as well as other ingredients or elements described herein. As used herein, "comprising" is open ended and means the elements recited, or their equivalent in structure or function, plus any other element or elements which are not recited. The terms "having" and "including" are also to be construed as open ended unless the context suggests otherwise.

Following long-standing patent law convention, the terms "a", "an", and "the" refer to "one or more" when used in this application, including the claims. Thus, for example, reference to "a cell" includes a plurality of such cells, and so forth.

Unless otherwise indicated, all numbers expressing quantities of ingredients, properties such as reaction conditions, and so forth used in the specification and claims are to be understood as being modified in all instances by the term "about". Accordingly, unless indicated to the contrary, the numerical parameters set forth in this specification and claims are approximations that can vary depending upon the desired properties sought to be obtained by the presently-disclosed subject matter.

As used herein, the term "about," when referring to a value or to an amount of mass, weight, time, volume, concentration or percentage is meant to encompass variations of in some embodiments ±20%, in some embodiments ±10%, in some embodiments ±5%, in some embodiments ±1%, in some embodiments ±0.5%, and in some embodiments ±0.1% from the specified amount, as such variations are appropriate to perform the disclosed method.

As used herein, ranges can be expressed as from "about" one particular value, and/or to "about" another particular value. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, "optional" or "optionally" means that the subsequently described event or circumstance does or does not occur and that the description includes instances where said event or circumstance occurs and instances where it does not. For example, an optionally variant portion means that the portion is variant or non-variant.

As used herein, "ambient" or "ambient conditions" means atmospheric and/or room conditions. Atmospheric conditions are known to those of ordinary skill in the art, and include a temperature of between 15° C. and 30° C., a relative humidity of between 5% and 70%, and an oxygen concentration of between 20% and 22%.

The presently-disclosed subject matter is based, at least in part, on the discovery that a perovskite thin film can be formed utilizing a one- or two-step deposition of perovskite that is rapidly sintered using an intense pulsed light source. More specifically, it has been observed that a heat treatment has the capability of sintering deposited perovskite layers at temperatures above the routinely observed degradation temperature without degrading the perovskite material. In addition, it has been observed that the rapid sintering of the deposited perovskite thin film is capable of creating large crystal sizes approaching 1 micron without sacrificing surface coverage.

The presently-disclosed subject matter thus includes methods for forming a perovskite thin films and/or electronic devices including perovskite thin films. In particular, the presently-disclosed subject matter includes methods for forming a perovskite thin film whereby a perovskite layer is deposited on a substrate and is subsequently sintered with intense pulsed light for a time period. The resulting perovskite film may form at least a portion of any electronic device suitable for including a perovskite material, such as, but not limited to, a solar cell, a light emitting diode (LED), a transistor, a sensor, or a combination thereof.

The term "perovskite," as used herein, refers to a material having the general structural formula $ABX_3$. In some embodiments, the "A" component of the material is selected from methylammonium $CH_3NH_3$ (MA), Formamidinum $CH(NH_2)_2$ (FA), and n-butylammonium and tetra-butylammonium $C_4H_9NH_3$ (BA); the B component is selected from Pb, Sn; and the X component is selected from I, Cl, Br and variants thereof. Additionally or alternatively, in the case of an organometal halide, the A site refers to an organic group, B represents a metal such as lead, and X is a halide group such as iodide, chloride, or bromide. For example, suitable perovskite materials include, but are not limited to, materials selected from the group consisting of: $MAPbI_3$, $MAPbBr_3$, $MAPbI_xBr_{3-x}$, $MAPbI_xCl_{3-x}$, $FAPbI_3$, $FAPbBr_3$, $FAPbI_xBr_{3-x}$, $FAPbI_xCl_{3-x}$, $BAPbI_3$, $BAPbBr_3$, $BAPbI_xBr_{3-x}$, $BAPbI_xCl_{3-x}$, $MASnI_3$, $MASnBr_3$, $MASnI_3BR_{3-x}$, $FASnI_3$, $FASnBr_3$, $FASnI_xBr_{3-x}$, $FASnI_xCl_{3-x}$, $BASnI_3$, $BASnBr_3$, $BASnI_xBr_{3-x}$, $BASnI_xCl_{3-x}$, and combinations and mixtures thereof. In some embodiments, the choice of Cl as the halide results in a wider than ideal bandgap, but allows for a film deposition in an uncontrolled environment. Further additions of a surfactant both improve the surface coverage and affect the grain growth during the IPL process.

In some embodiments, a method for forming a perovskite electronic device, such as a perovskite solar cell, includes providing a substrate, forming an electron transporting layer over the substrate, and forming a perovskite layer over the electron transporting layer. In one embodiment, the method is performed under ambient conditions. In another embodiment, the method decreases processing time as compared to existing methods, such as conventional annealing methods. In a further embodiment, the method increases density and/or surface coverage of the perovskite layer as compared to existing methods, such as conventional annealing methods.

The substrate includes any suitable material for withstanding the processing conditions and supporting the layers applied thereto. Withstanding the processing conditions, as used herein, refers to maintaining or substantially maintaining structural and/or chemical properties following exposure to processing conditions. In some embodiments, the substrate is transparent and/or electrically conductive. For example, one suitable substrate includes a transparent glass substrate with a transparent electrically conductive fluorine-doped tin oxide (FTO) coating thereon. In some embodiments, the substrate is flexible. Suitable flexible substrates include, but are not limited to, polymers, such as plastics. Additionally or alternatively, in certain embodiments, at least one side of the substrate is etched and/or otherwise pre-treated. Etching the substrate includes any suitable method known to those skilled in the art, such as, for example, etching FTO coated glass substrates using zinc powder and HCl.

In some embodiments, the electron transporting layer is applied to the substrate by making use of spin coating techniques known to those skilled in the art, and can be applied to a thickness of about 200 nm to about 500 nm. In one embodiment, electron transport layer is comprised of a hole blocking layer. In another embodiment, the thin film optionally includes a mesoporous layer in addition to the hole blocking layer. The term "hole blocking layer," which is commonly used in connection with solar cells, is synonymous with the term "electron transport layer," which is commonly used in connection with LEDs. As such, the two terms are used interchangeably throughout the instant specification to refer to the same layer.

The hole blocking layer layer, which is applied over the substrate, preferably has a thickness of between about 10 nm and about 100 nm, more preferably between about 25 nm and about 75 nm, and most preferably between about 40 nm and about 60 nm. The hole blocking layer includes any suitable material for forming a film that is free or substantially free of pin-holes which may cause shunting (e.g., a film having sufficient density to avoid, eliminate, or substantially eliminate shunting). In one embodiment, the hole blocking layer includes a hole blocking $TiO_2$ layer. In another embodiment, the hole blocking $TiO_2$ layer includes titanium diisopropoxide bis(acetylacetone) (TAA). Although described above with regard to a hole blocking $TiO_2$ layer, as will be appreciated by those of ordinary skill in the art, the hole blocking layer is not so limited, and may include any other material and/or thickness suitable for avoiding, eliminating, or substantially eliminating shunting.

Application of the hole blocking layer includes any suitable process based upon the substrate material and/or composition of the hole blocking layer. For example, in some embodiments, applying the TAA to the substrate includes dispersing a TAA solution in a solvent, such as anhydrous 1-butanol, spin coating the solution onto the substrate, and then heating the TAA coated substrate to remove the solvent. The spin coating of the hole blocking layer includes any suitable rotational speed and/or combination of speeds to provide the desired coating. Similarly, the heating of the hole blocking layer includes any suitable temperature and/or duration to remove the solvent. For example, in one embodiment, the solution is spin coated onto the substrate at 700 rpm for 8 s, 1000 rpm for 10 s, then 2000 rpm for 40 s, without stopping between the different speeds. In another embodiment, the coated substrate is heated on a hot plate set at 120° C. for 5 minutes. Additionally or alternatively, in certain embodiments, the TAA is wiped off one or more portions of the substrate to provide $TiO_2$-free contact areas.

The mesoporous layer, which is optionally applied over the hole blocking layer, preferably has a thickness of between about 100 nm and about 400 nm, more preferably between about 150 nm and about 350 nm, and most preferably between about 200 nm and about 300 nm. The mesoporous layer includes any suitable material for forming the desired porosity over the hole blocking layer and/or receiving the perovskite layer thereon/therein. In one embodiment, other than porosity, the mesoporous layer is substantially similar to the hole blocking layer. For example, in another embodiment, both the hole blocking layer and the mesoporous layer include $TiO_2$. In a further embodiment, the mesoporous layer is formed from Dyesol 18NR-T $TiO_2$. Alternatively, the hole blocking layer and the mesoporous layer may have different compositions.

Application of the mesoporous layer includes any suitable process based upon the composition of the hole blocking layer and/or the mesoporous layer. For example, in some embodiments, applying the mesoporous layer includes diluting a Dyesol 18NR-T $TiO_2$ paste in a solvent, such as ethanol, spin coating the solution over the hole blocking layer, and then heating the mesoporous coated substrate to remove the solvent. The $TiO_2$ paste and solvent are provided at any suitable concentration for forming a well-dispersed solution, such as, but not limited to, a 1:4 mixture, by weight, of Dyesol 18NR-T $TiO_2$ paste to ethanol. Next, the spin coating is performed at any suitable rotational speed to provide the desired thickness. In one embodiment, for example, the 1:4 mixture above is spin coated at 2000 rpm for 60 s to produce a thickness of 200-300 nm. Following the spin coating, the substrate is heated at any suitable temperature and for any suitable duration to remove the solvent. Suitable temperatures and durations include, but are not limited to, heating on a hot plate set at 120° C. for 5 minutes. In certain embodiments, following the spin coating and prior to the heating, the $TiO_2$ paste is wiped off one or more portions of the substrate to provide $TiO_2$-free contact areas.

Once the solvent has been removed from the applied mesoporous layer, the substrate is heated to crystallize and sinter the particles of the hole blocking layer and/or the mesoporous layer. The heating may include, for example, placing the coated substrate in an oven or furnace at 500° C. for 1 hour to crystallize and sinter the $TiO_2$ particles. Additionally or alternatively, in some embodiments, the coated substrate is optionally treated to fill any remaining pinholes in the film. In one embodiment, treating the coated substrate includes contacting the coated substrate with a solvent while applying heat. For example, in another embodiment, the coated substrate is placed in a $TiCl_4$ solution, including $TiCl_4$ in 20% HCl diluted to 40 mM in DI water, and then heated in an oven at 70° C. for 30 minutes to fill any remaining pinholes in the film. Next, the substrate is removed from the solution and rinsed with water to clean away any unreacted solvent. After rinsing, the substrate is heated at 500° C. for 30 minutes to crystallize the thin layer of $TiO_2$ provided by the $TiCl_4$ solution.

After optionally treating the coated substrate and/or crystallizing the $TiO_2$ particles, a perovskite layer is formed over the hole blocking layer or, if present, the mesoporous layer. In some implementations, the perovskite layer is deposited onto the coated substrate using a two-step procedure. For instance, in certain implementations, forming a methylammonium lead iodide ($CH_3NH_3PbI_3$) perovskite layer perovskite layer includes first applying a lead iodide ($PbI_2$) layer over the hole blocking layer or mesoporous layer. The $PbI_2$ layer is applied by any suitable method, such as, but not limited to, spin coating followed by heating. For example, in one embodiment, $PbI_2$ is mixed with a solvent, such as dimethylformamide (DMF) anhydrous or dimethyl sulfoxide (DMSO), and heated on a hot plate at 80° C. Next, the substrates are preheated to between about 45° C. and 60° C., and then spin coated with the hot $PbI_2$ solution. Although any desired coating thickness may be formed, the $PbI_2$ layer preferably includes a thickness of about 100 nm to about 400 nm, more preferably from about 150 nm to about 350 nm, and most preferably from about 200 nm to about 250 nm. In certain embodiments, the rotational speed of the spin coating is selected to provide the desired coating thickness, including, but not limited to, spin coating at 4000 rpm for 20 seconds to provide coverage of about 200 nm to about 250 nm on top of the hole blocking or mesoporous $TiO_2$ layer.

After forming the $PbI_2$ layer, the coated substrate is exposed to a conversion solution configured to grow perovskite crystal thereof. In one embodiment, the conversion solution includes methylammonium iodide (MAI) and/or a mixture of MAI and anhydrous isopropanol. In another embodiment, the substrate is dipped in the mixture of MAI and anhydrous isopropanol for about 90 seconds, then heated to grow the perovskite crystals over the hole blocking layer, or over and/or within the pores of the mesoporous layer. In a further embodiment, heating includes placing the substrate on a hot plate set at 70° C. for 30 minutes to grow the perovskite crystals. Additionally, the substrate is optionally dipped in isopropanol for a few seconds before and/or after reaction with the conversion solution.

In an alternate embodiment, forming the perovskite layer includes a one-step deposition method that does not utilize secondary solvents for solvent-solvent extraction. In some embodiments, the one-step deposition method includes dissolving $PbI_2$ and a methyl-ammonium precursor in a solvent to form a perovskite precursor composition, spin coating the perovskite precursor composition over the hole blocking layer or mesoporous layer of the substrate, then evaporating the solvent to initiate a nucleation process for forming the perovskite crystals. More specifically, in one embodiment, the perovskite precursor composition is hot-deposited over the substrate.

In another embodiment, the one-step deposition method includes adding an alkyl halide to the $PbI_2$ and a methyl-ammonium precursor to form a perovskite precursor composition, spin coating the perovskite precursor composition over the hole blocking layer or mesoporous layer of the substrate, then evaporating the solvent to initiate a nucleation process for forming the perovskite crystals. In some embodiments, $CH_2I_2$ is a suitable alkyl halide to add to $PbI_2$. Additionally, $CH_2ClI$ and $CH_2Cl_2$ are examples of other alternatives that can be added to a metal halide (e.g. $PbI_2$) for these purposes. In some embodiments, $PbCl_2$ may be used instead of $PbI_2$, as well as $SnI_2$ and $SnCl_2$, respectively. In some embodiments, the formulation also includes DMF and DMSO.

In some embodiments, the films are then rapidly annealed using IPL technique under ambient conditions. In other embodiments, the perovskite precursor composition is thermally treated after deposition but prior to the IPL process, wherein the thermal treatment may include placing the films on a hotplate at 75° C. for up to 2 min or exposed to infrared (IR) for up to 30 seconds under ambient conditions to initiate the nucleation process. In some embodiments, the IPL process includes exposing the films to up to five flashes each having a duration of two milliseconds with an energy density of 25 J cm$^{-2}$. As discussed in more detail below, the number of IPL pulses and the energy density may vary.

In some embodiments, the $CH_2I_2$ concentrations can vary between 0.125 to 0.375 ml $CH_2I_2$ per 1 ml DMF and 0.125 ml DMSO. However, the preferred $CH_2I_2$ concentration is 0.25 ml of $CH_2I_2$ additive and further increases of the $CH_2I_2$ concentration generally result in a decrease in the efficiency of the solar cell. In some embodiments, the number of IPL pulses for an alkyl halide solar cell can range from zero pulses, to 1 pulse, 5 pulses, 10 pulses, and more than 10 pulses. Generally a single pulse is not sufficient to increase the performance of the solar cell and increasing the number of pulses to greater than or equal to 10 pulses may result in a non-working device. In some embodiments, 5 pulses delivers sufficient energy to have a major impact on the perovskite film.

Any suitable alkyl halide, having the formula $RX_2$, wherein R represents an alkyl group comprising 1-20 carbon atoms and X represents the halide, may be used as an additive to the $MAI/PbI_2$ precursor chemistry. In some embodiments, the halide (X) may be chosen from the group chloride, bromide, and iodide. Alternatively, the halide may be fluorine. The halide component may also be combinations such as $I_2$, $Cl_2$, and $Br_2$, or any suitable combinations of two halides such as ClI and BrI. Thus, in some embodiments the alkyl halide is chosen from the group $CH_2ClI$, $CH_2CL_2$, $CH_2I_2$, $CH_2Cl_2$, $CH_2Br_2$, $CH_2ClI$ and $CH_2BrI$. In addition, the suitable number of carbons in the alkyl group (n) may range between 1-20 carbons. As the number of carbons increases, so does the boiling point and viscosity of the alkyl halide. The boiling point also increases as the atomic number of the halide increases. High boiling point halides may impede the performance of the solar cell as they may remain in the film. Short chain alkyls are preferred for good evaporation kinetics; however, long chain alkyls are preferred for coating uniformity. Thus in some embodiments it may be beneficial to incorporate both long and short chain alkyl halides.

In another embodiment, hot-depositing includes placing the $TiO_2$ deposited substrates on a hotplate at 100° C., and maintaining the perovskite precursor composition at 70° C. The heated precursor solution is then spin coated over the heated substrate at any suitable rotational speed, including, but not limited to, 2000 rpm for 10 seconds.

Any suitable methyl-ammonium precursor may be used in forming the perovskite precursor composition, including, but not limited to, MAI, Methylammoniumchloride (MACl), or a combination thereof. Similarly, any suitable solvent may be used to dissolve the $PbI_2$ and the methyl-ammonium precursor, such as, but not limited to, DMSO, DMF, or a combination thereof. For example, in one embodiment, the perovskite precursor composition includes a 1:1 ratio of $PbI_2$ and MACl dissolved in DMF. Additionally or alternatively, in another embodiment, a surfactant is added to the perovskite precursor composition. In a further embodiment, the surfactant includes polyvynylpyrollidone (PVP). Without wishing to be bound by theory, it is believed that PVP influences the crystal formation of the perovskite layer, improves surface coverage of the films, and/or assists in forming mixed halide perovskite by binding nucleation sites closer together.

Following the formation of perovskite crystals through any one or more of the methods disclosed herein, the perovskite layer is post-treated with intense pulsed light (IPL). IPL is a contactless form of rapid annealing in which fast millisecond pulses of broad light (e.g., 150-1000 nm) are directed towards and absorbed by a material. The absorbed energy is rapidly dissipated as heat energy, which sinters the material particles together. In some implementations, to control the transformation of the perovskite layer during the IPL process and/or the absorbed energy of the intense pulsed light, the IPL process is carried out by using one or a series of short pulses. The time scales of the short pulse(s) can range from microseconds to 10 ms. For instance, in one embodiment, a duration of the short pulses includes, but is not limited to, between about 2 ms and about 5 ms per pulse. In another embodiment, each pulse is about a 2 ms pulse. In a further embodiment, the sintering can occur using a single pulse of 2 ms. In other implementations, however, it may be advantageous to utilize multiple pulses (e.g., up to 20 pulses, between 2 and 20 pulses, or between 5 and 20 pulses) in order to remove excess solvents.

Additionally or alternatively, the energy input of the pulses may be selected to control the transformation of the perovskite layer during the IPL process and/or the absorbed energy of the intense pulsed light. For example, in one embodiment, the IPL includes at least 1250 J/pulse, preferably at least 1750 J/pulse, and more preferably at least 2000 J/pulse.

In certain embodiments, the IPL treatment disclosed herein densifies the surface coverage, realigns the crystal orientation to a preferred orientation, increases photovoltaic efficiency, provides sintering of materials previously thought to degrade at the elevated temperatures formed during IPL, and/or facilitates forming of a perovskite solar cell through a synergistic relationship between the deposition chemistry and the IPL process. For example, the IPL treatment with an energy input of 2000 J generates a film temperature of slightly higher than 750° C., which remains above 150° C. for almost 20 ms. Although the peak temperature is significantly higher than the previously understood degradation temperature of 150° C. for CH$_3$NH$_3$PbI$_3$ films, the IPL treatment sinters the particles without or substantially without degrading the material. Thus, the methods described herein provide the formulation of an ink that can be deposited to a substrate in atmospheric conditions and processed rapidly using IPL.

In some embodiments, the method further includes depositing a hole transport material, also referred to herein as an electron blocking material, over the substrate. In one embodiment, the hole transport/electron blocking material is applied to the substrate prior to applying the perovskite layer. Alternatively, the hole transport/electron blocking material may be applied to the substrate after applying the perovskite coated substrate. Suitable materials for the hole transport/electron blocking layer include, but are not limited to, 2,20,7,70-Tetrakis(N,N-di-p-methoxyphenylamine)-9, 90-spirobifluorene (Spiro-MeOTAD), OMeTPA-FA, PEDOT:PSS, P3HT, CuSCN, Nickel Oxide, H101, EDOT-OMeTPA, CzPAF-SBF, Polythiophene, or a combination thereof. The hole transport/electron blocking layer may be deposited by any suitable method, including, but not limited to, spin coating. In one embodiment, for example, the spiro-MeOTAD layer is prepared by dropping a spiro-MeOTAD solution onto the perovskite coated substrate until it covers the entire film (70 µL), then spinning the substrate at 1700 rpm for 30 s to get a thickness of 200 nm. In another embodiment, the spiro-MeOTAD solution is prepared by dissolving spiro-MeOTAD in chlorobenzene along with 4-tert-butyl-pyridine, lithium bis(trifluoromethylsulfonyl) imide in anhydrous acetonitrile, and Dyesol cobalt dopant FK209 TFSI salt in anhydrous acetonitrile.

Additionally or alternatively, one or more contacts are formed over a surface of the substrate. In one embodiment, forming the contacts includes first scraping off the ends of the substrate using a blade to expose the etched and FTO side without TiO$_2$. Next, the contact, such as gold, is deposited using a thermal evaporator. Finally, 100-nm-thick Au electrode was deposited via thermal evaporation.

Once the initial perovskite layer has been deposited, in some implementations, the perovskite layer then undergoes a heat annealing process by which the perovskite is exposed to an elevated temperature to form a more uniform and crystallinized perovskite film. Unlike prior methods of forming a perovskite thin film, however, and in particular those that make use of methylammonium lead iodide perovskite layers, the presently-described methods do not utilize a annealing process whereby a lower amount of heat (e.g., heating to a temperature less than 150° C.) is applied over a longer period of time, such as by use of a heating plate. Rather, in the presently-disclosed methods, an intense pulsed light (IPL) sintering process is utilized. In this regard, in some implementations that make use of an IPL process to sinter the perovskite layer, the intense pulsed light sintering is performed at an intense pulsed light energy of about 1000 J/pulse, about 1100 J/pulse, about 1200 J/pulse, about 1300 J/pulse, about 1400 J/pulse, about 1500 J/pulse, about 1600 J/pulse, about 1700 J/pulse, about 1800 J/pulse, about 1900 J/pulse, or about 2000 J/pulse. In some implementations, by making use of an IPL process to sinter the perovskite thin film, the IPL process allows the perovskite film to approach temperatures of 400° C. to 750° C. to produce a crystalline perovskite layer having a dense and smooth surface, but without damaging the perovskite structure in the process. In some implementations, the intense pulsed light sintering is performed with a xenon light.

For example, in one embodiment, the method includes subjecting a one- or two-step deposited thin film of methylammonium lead iodide perovskite to 2000 Joules of energy in a 2 ms pulse of light generated by a xenon lamp, which results in temperatures significantly exceeding the routinely observed degradation temperature of 150° C. In another embodiment, this IPL sintering forms solar cells having a dense and smooth surface, and an average efficiency of at least 11.5% and a champion device of at least 12.3%, without degrading the perovskite material. Without wishing to be bound by any particular theory or mechanism, it is believed that the presently-described process therefore provides improvements in the manufacturability of perovskite solar cells, or other perovskite containing electronic devices, by eliminating the common rate-limiting annealing step. Additionally or alternatively, the presently-described process enables and/or permits production of perovskite solar cells or other perovskite containing electronic devices via a continuous roll-to-roll process that is similar to the printing press used in the newspaper industry.

According to one or more of the embodiments disclosed herein, the method of forming a perovskite solar cell provides the ability to use high intensity pulses of light to sinter thin films without or substantially without damaging CH$_3$NH$_3$PbI$_3$. Another advantage of IPL is the high processing speed. Rather than spending hours in an oven or programming a laser to follow the deposition path, IPL can cover large areas (~200 cm×10 cm) in <2 ms. A further advantage of the presently-disclosed process is the elimination of concern about the resulting porosity in the as-deposited film. The advantageous ability to sinter at high temperatures over large areas without affecting the substrate composition facilitates the ability to produce flexible plastic solar cells made on a printing press akin to the newspaper industry.

As will be appreciated by those of ordinary skill in the art, although described above as an ordered coating with a hole blocking layer over the substrate, an optional mesoporous layer over the hole blocking layer, a perovskite layer over the hole blocking layer or optional mesoporous layer, and an optional hole transport/electron blocking layer over the perovskite layer, the perovskite film and/or device is not so limited, and may include any other suitable order of layers. For example, one embodiment, the film/device may include the layers in reverse order, where the optional hole transport/electron blocking layer is deposited directly over the substrate, followed by the perovskite layer, the optional mesoporous layer, and then the hole blocking layer. In another embodiment, a method of forming a perovskite solar cell includes depositing a hole transport/electron blocking layer over a substrate, forming a perovskite layer over the hole transport/electron blocking layer, and sintering the perovskite layer with intense pulsed light. In a further embodiment, a method of forming a perovskite LED includes depositing a hole transport/electron blocking layer over a substrate, forming a perovskite layer over the hole transport/electron blocking layer, and sintering the perovskite layer with intense pulsed light.

The presently-disclosed subject matter is further illustrated by the following specific but non-limiting examples.

EXAMPLES

Example 1

Materials and Methods
Abbreviations.
MAI, Methylammonium iodide; TiO$_2$, Titanium dioxide; TAA, Titanium diisopropoxide bis(acetylacetonate); TiCl$_4$, Titanium tetrachloride; HCl, Hydrochloric acid; DMF, Dimethylformamide; IPL, Intense pulsed light; $CH_3NH_3PbI_3$, Methylammonium lead iodide; $PbI_2$, Lead iodide; NMP, N-Methylpyrrolidone; XRD, X-ray diffraction; CdS, Cadmium sulfide.

Materials.

Unless stated otherwise, all materials were purchased from Sigma Aldrich. Spiro-MeOTAD was purchased from Merck. Methylammonium Iodide (MAI), $TiO_2$ paste, and cobalt dopant FK202 were purchased from Dyesol.

Device Fabrication.

Etching, $TiO_2$ deposition, and IPL sintering steps were conducted in ambient conditions outside of a glove box. All other steps were done in a nitrogen glove box with less than 150 ppm moisture and less than 10 ppm oxygen. IPL processing conditions were performed in a sealed container with a nitrogen atmosphere.

Etching.

FTO coated slides of glass were etched using zinc powder and 2M HCl.

Cleaning.

Slides were sonicated in Hellmanex detergent for 10 minutes, then DI water for 10 minutes, followed by ethanol for 10 minutes, then again in DI water for 10 minutes. After cleaning the slides, they were dried under a stream of compressed air. Next, the slides were cleaned under an oxygen plasma to get rid of any remaining residue followed by a UV treatment for 30 minutes.

Hole Blocking $TiO_2$ Layer.

A 0.15M Titanium diisopropoxide bis(acetylacetonate) "TAA" (CAS: 17927-72-9) solution was dispersed in anhydrous 1-butanol. The solution was spin coated onto slides at 700 rpm for 8 s, 1000 rpm at 10 s, and then 2000 rpm for 40 s. The slide was not stopped between the different spin speeds. The solution was dropped onto the slide during the first 10 s of the spinning. After spin coating, the TAA was wiped off the sides with a cotton swab to provide two sides without $TiO_2$ for contacts. The slides were heated on a hot plate set at 120° C. for 5 min to remove the solvent.

Mesoporous $TiO_2$ Layer.

Dyesol 18NR-T $TiO_2$ paste was diluted in a mixture of 1:4 by weight with ethanol and sonicated until it became a well-dispersed solution. The solution was spin coated at 2000 rpm for 60 s to produce 200-300 nm thickness. The solution was dropped onto the slide to cover the entire slide before spinning. After spin coating, the ends were cleaned off the $TiO_2$ paste with a cotton swab to provide two sides without $TiO_2$ for contacts. The slide was heated on a hot plate set at 120° C. for 5 min to remove the solvent. The slides were then heated in an oven at 500° C. for 1 h to crystallize and sinter the $TiO_2$ particles.

$TiCl_4$ Treatment.

A 90 mM solution of $TiCl_4$ (CAS: 7550-45-0) in 20% HCl was diluted to 40 mM in DI water. The slides were placed in the solution and heated in an oven at 70° C. for 30 min to fill any remaining pinholes in the film. The slides were removed and rinsed with water to clean away any unreacted solvent. Slides were heated at 500° C. for 30 min to crystallize the thin layer of $TiO_2$ provided by the $TiCl_4$ solution.

Lead Iodide Layer.

498 mg/ml of lead iodide (CAS: 10101-63-0) was mixed with Dimethylformamide (CAS: 68-12-2) "DMF" anhydrous using a stir bar and heated on a hot plate at 80° C. Slides were preheated on a hot plate to ~45-60° C., as checked using an IR thermometer. Slides were moved quickly to the spin coater and the hot solution of lead iodide was dropped onto the cell using a glass pipet until the cell was fully covered. Following the drops, the slides were spun at 4000 rpm for 20 seconds to get a coverage of 200-250 nm on top of the mesoporous $TiO_2$ layer. Following spin coating, the slides were placed on the edge of hot plate until the batch was finished and then heated on a hot plate set at 100° C. for 5 min.

Perovskite Reaction.

A mixture of 10 mg/ml of MAI (CAS: 14965-49-2) was mixed with anhydrous isopropanol. The mixture was shaken until evenly dispersed. Slides were dropped into a solution of isopropanol for 2-3 s before being dipped into a mixture of MAI and isopropanol for 90 s. After conversion, the slide was dipped again in isopropanol for a few seconds to clean off any unreacted MAI solution. Reference slides were heated on a hot plate set at 70° C. for 30 min to grow perovskite crystals. IPL sample conditions are explained in further detail below.

Spiro-MeOTAD.

72.3 mg of Spiro-MeOTAD (CAS: 207739-72-8) was shaken in 1 mL of chlorobenzene until dissolved. 28.8 μL of 4-tert-butyl-pyridine (CAS: 3978-81-2) was pipetted into the solution and shaken until dissolved. 17.5 μL of stock solution of 520 mg/ml lithium bis(trifluoromethylsulphonyl) imide (CAS: 90076-65-6) in anhydrous acetonitrile was added to the solution and shaken until mixed. 29 μL of Dyesol cobalt dopant FK209 TFSI salt (CAS: 1447938-61-5) 300 mg/ml in anhydrous acetonitrile was added to the solution and shaken until mixed. Spiro-MeOTAD solution was dropped onto the perovskite slides until it covered the entire film (70 μL) and spun at 1700 rpm for 30 s to get a thickness of 200 nm.

Contacts.

Ends of the slides were scraped off using a blade to expose the etched and FTO side without $TiO_2$. 100 nm of gold was deposited using a thermal evaporator.

Device Characterization.

The material crystallinity and phases were studied using a Bruker AXS D8 X-ray Diffractometer. The equipment was operated with an X-ray source of $CuK_\alpha$ ($\lambda=0.1548$ nm), a position sensitive detector (PCD), a scan speed of 4.0 s/step and step size of 0.02°. XRD patterns were measured using the 0-2θ method in the 2θ range of 10–80°. An FEI Nova NanoSEM 600 was used to study the morphology of the surfaces and the cross sections of the devices with an accelerating voltage of 10 kV and a working distance of 5-6 mm. Cross-sectional images of the as-deposited and IPL-treated films were performed by mechanically breaking the sample. Photoluminescence measurements were carried out using a Renishaw in Via Raman microscope, with a CCD detector and a 632 nm He—Ne laser as the excitation source. The potential was scanned with an eDAQ potentiostat using a scan rate of 10 $mVs^{-1}$. The films were illuminated from the front side using an AM 1.5 simulated light from a Newport 300 W Xenon Arc lamp.

Finite Element Analysis.

The finite element analysis was carried out using COMSOL multiphysics 5.1 software.

Results and Discussion

As described in further detail below, $CH_3NH_3PbI_3$ perovskite films were successfully sintered using IPL. Perovskite films were subjected to varying energy intensities and their resulting surface coverage, crystal size, and performances were recorded. X-ray diffraction (XRD) studies show the chemical composition was unchanged and the perovskite structure was not damaged during the process. Without wishing to be bound by any particular theory, it was believed that the methodology can be used as part of a scalable method to mass-produce perovskite solar cells as shown in FIG. 1. Individual cells measuring 60 cm² can be sequentially deposited using traditional printing techniques and connected in series using a conductive trace. The perovskite layer can then be subjected to a very fast pulse of light to sinter the material, resulting in a smooth large grain film. Without the rate-limiting step of long annealing times, the process can be a continuous roll-to-roll process similar to the printing press used in the newspaper industry.

With respect to the solar cells, perovskite solar cell devices were fabricated using a sequential approach detailed above. The device consisted sequentially of a 50 nm $TiO_2$ hole-blocking layer, a 150-250 nm mesoporous $TiO_2$ electron-transport layer with $CH_3NH_3PbI_3$ perovskite crystals filling the pores, a 150 nm layer of hole-transport layer Spiro-MeOTAD, and an 80 nm layer of gold on top of the hole transport material to make a contact.

Perovskite layers were typically heated on a hot plate to thermally anneal the layer to reduce grain boundaries and enlarge crystal size. The resulting films were in the tetragonal crystal structure of $CH_3NH_3PbI_3$ perovskites. Poor film surface coverage is common in this formation. The gaps within the perovskite film cause lower shunt resistance and lower short circuit current densities when the hole transport layer is in direct contact with the electron transport layer. This has spurred research attempts to densify the morphology of the perovskite layer to prevent shunting pathways and improve the fill factor and reproducibility of perovskite solar cells. Research has shown that increasing the annealing temperature leads to an increase in the efficiency of the perovskite solar cell until 150° C. At this temperature, the perovskite begins to decompose into $PbI_2$.

IPL is a contactless form of rapid annealing in which fast millisecond pulses of broad light, 150-1000 nm, are produced from a Xenon plasma bulb and absorbed by the material. The absorbed energy is rapidly dissipated as heat energy. Previous research has shown that IPL treatment on CdTe solar cells densified the surface coverage, realigned the crystal orientation to a preferred orientation, and increased photovoltaic efficiency. CIGS solar cells have also benefited from IPL research. Others have reacted selenium nanoparticles into a thin film of $Cu(In_{0.7}Ga_{0.3})$ (CIG) metallic alloy nanoparticle precursors using IPL within milliseconds. They were also able to melt and recrystallize CIGS particles into larger grains without structural deformation or phase transformation. The advantageous short time scale of IPL processing would be ideal for manufacturing perovskite solar cells without degradation and possibly allow for higher temperature processing in short bursts.

The degradation of the $CH_3NH_3PbI_3$ by prolonged exposure to oxygen, moisture and ultraviolet (UV) has been discussed, with mean time to failure time on the order of hours. In the case of UV exposure, the absorption of these energies by the $TiO_2$ layer can initiate a free electron, which degrades the $CH_3NH_3PbI_3$ at the interface. Removing the contact between the $TiO_2$ and $CH_3NH_3PbI_3$ interface has been shown to reduce the degradation confirming the photodegradation. The two areas of concern with the IPL method are the high heats that will result in the films and the exposure to UV both with the potential to destroy the $CH_3NH_3PbI_3$ thin films. In the present experiments, the IPL was exposed to the $CH_3NH_3PbI_3$ layer (FIG. 1), which has a very high absorption in the UV region. Additionally, the time scale of exposure to UV and extended high temperatures was nearly instantaneous.

Intense pulsed light was applied to as-deposited perovskite films using varying energy densities at 2 ms pulses times. The SEM images of the IPL-treated films in FIG. 2 show that higher energy pulses increase the crystallite size and start to sinter the films.

Figure 2:
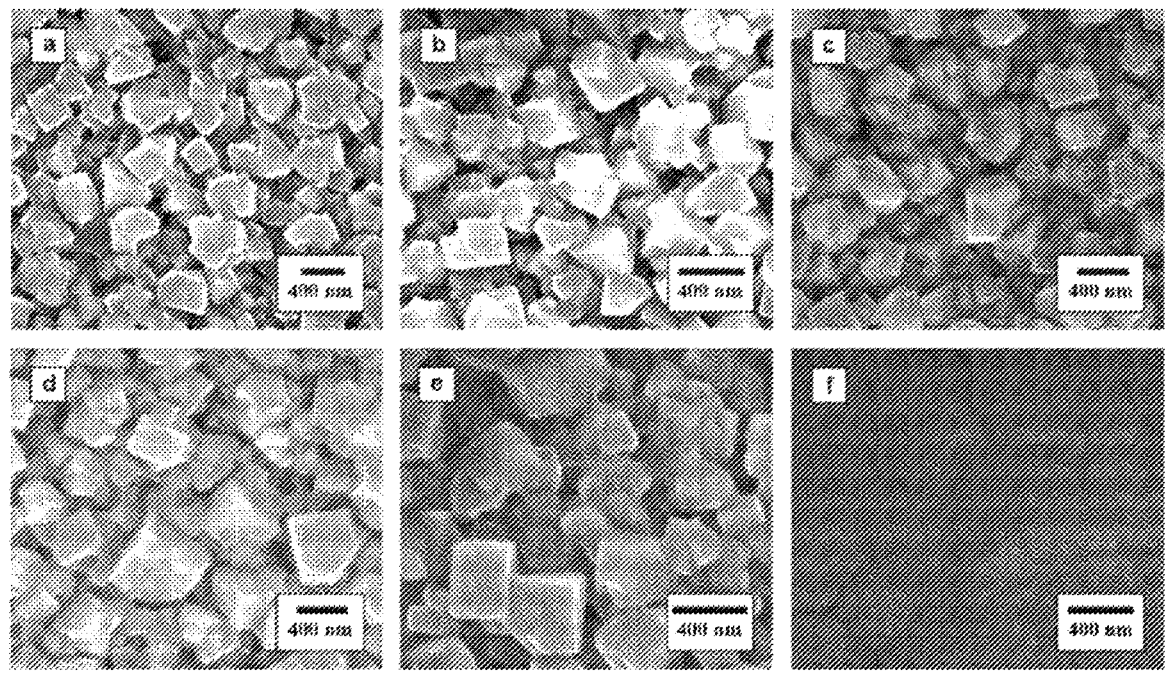
FIG. 2 shows top view SEM images of perovskite films (panel a) without IPL exposure, and after a 2 ms pulse of IPL exposure at (panel b) 1000 J/Pulse, (panel c) 1250 J/Pulse, (panel d) 1500 J/Pulse, (panel e) 1750 J/Pulse, and (panel f) 2000 J/Pulse.

FIG. 2 shows the transition of cubical particles into large dense particles. Very little change appears in the surface morphology at 1000 J/Pulse (FIG. 2, panel (b)). At 1250 and 1500 J/Pulse (FIG. 2, panels (c) and (d), respectively), the film begins to consolidate and surface coverage improves. At 1750 J/Pulse (FIG. 2, panel (e)), necking of the particles is shown and the perovskite begins to sinter together. The most radical change to the surface morphology is seen at 2000 J/Pulse (FIG. 2, panel (f)), in which the perovskite crystals have increased in size and sintered together to form a dense layer. Prior to this research, densification of this magnitude was only achieved by using an extra solvent extraction treatment like diethyl ether or using a less scalable chemical vapor deposition process. The present rapid heat treatment, however, delivered such a radical change to surface coverage. Previously, others researched the effect of using a flash annealing step from 100 to 130° C. with a hot plate and were able to create large crystal sizes and increased current density. However, the surface coverage was negatively impacted by the transition.

One aspect of the observed transformation was the rapid heat treatment at short incremental pulses. It has been observed that it is feasible to heat CdS to temperatures >700° C. during a single pulse. Using a similar energy density and the same equipment, it was conceivable for the perovskite to experience similar if not greater temperatures. Methylammonium lead iodide perovskite ($E_g$~1.6 eV) is known for its high light absorption properties and absorbs more of the visible spectrum than the larger band gap semiconductor CdS ($E_g$~2.42 eV). With a lower band gap, $CH_3NH_3PbI_3$ perovskite will absorb more light from the IPL spectrum than cadmium sulfide, causing a larger number of phonons to be generated and dissipated throughout the material as heat. IPL enables the perovskite to enter high temperatures significantly exceeding 150° C. without having the time to degrade.

The thermal diffusivity (D) of a thin film is the ratio of the thermal conductivity ($\kappa$=0.005 W/cm-K)[34], to the volumetric heat capacity ($\rho Cp$=1.28 $Jcm^{-3}K^{-1}$) and is a measure of how fast heat will move through a film. For the $CH_3NH_3PbI_3$ thin film, this is 0.0039 $cm^2$ $s^{-1}$. At a pulse duration of 2 ms, the diffusion length (2(Dt)0.5) of the film is 56 µm, which is significantly larger than the 300 nm thickness of the film. This would indicate a very fast thermal diffusion through the film. The response of the film on the glass substrate to the IPL pulse was accomplished using the Finite Element Analysis (FEA) method.

Figure 3:
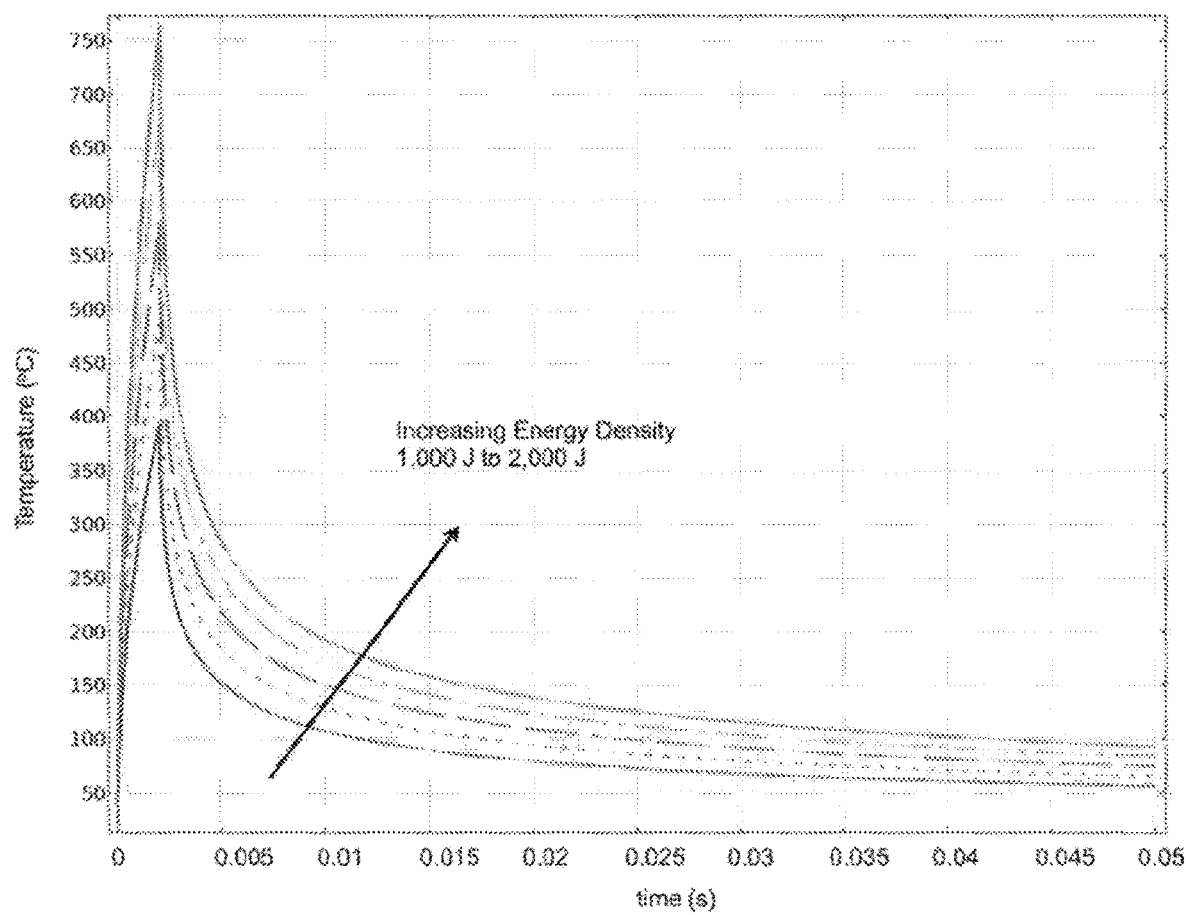
FIG. 3 shows temperature profiles as calculated using COMSOL finite element analysis of the $CH_3NH_3PbI_3$ thin film over time after subjected to pulse intensities of 1000, 1250, 1500, 1750 and 2000 J.

An FEA model was used to understand the temperature profile of the film as exposed to the varying energy densities used in the study. The $CH_3NH_3PbI_3$ thin films absorb 92% of the energy delivered by the pulses as measured using UV-vis spectrometry. The pulses from the lower energy input of 1000 J increased the temperature of the films to a maximum of nearly 400° C. and falling to under 150° C. in less than 5 ms. The higher energy input of 2000 J was able to reach a temperature slightly higher than 750° C., and the temperature of the film remains above 150° C. for almost 20 ms. (FIG. 3) Although all of the energy intensities managed to lift the temperature of the film over the maximum of 150° C., only the higher temperatures at prolonged duration managed to sinter the $CH_3NH_3PbI_3$.

Figure 4:
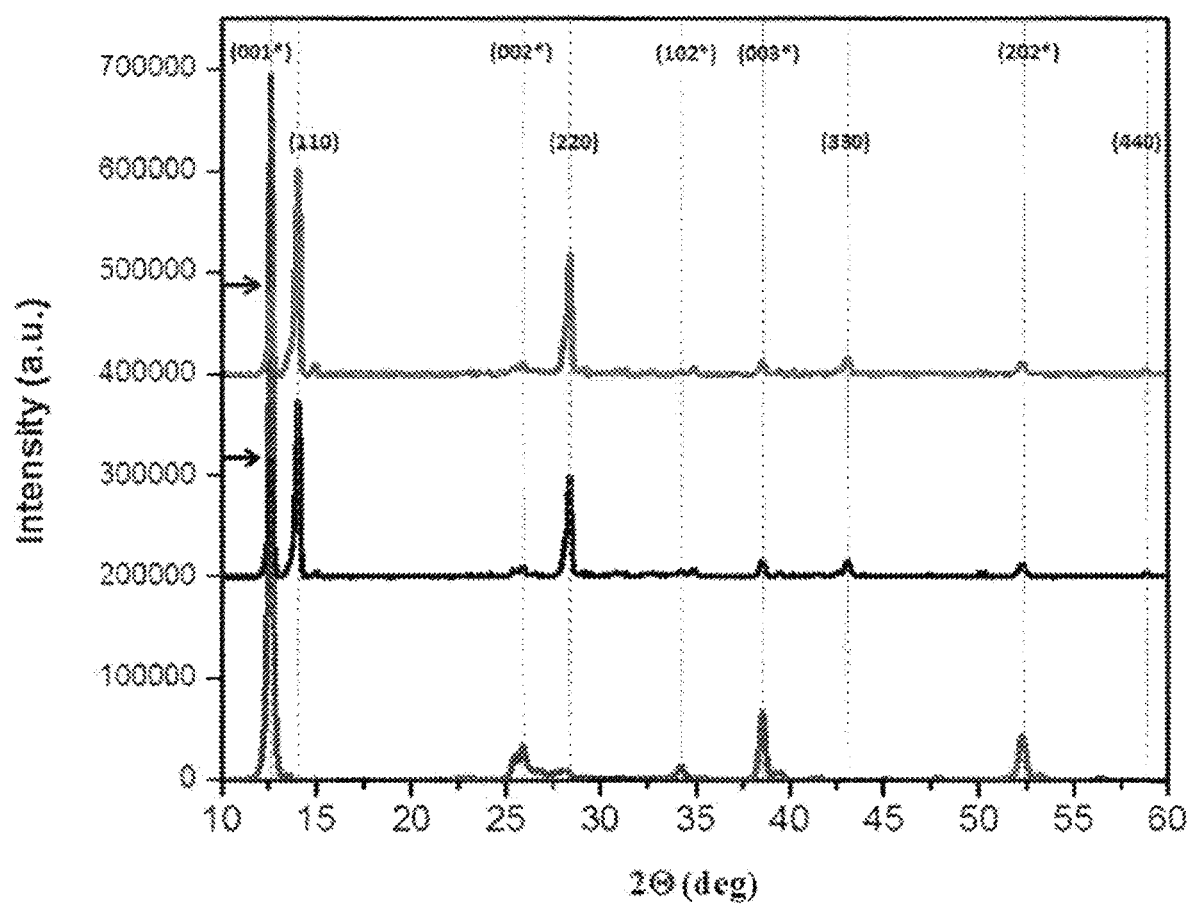
FIG. 4 shows X-ray diffraction of hot plate annealed perovskite (black), IPL sintered perovskite (red), and lead iodide (blue). Indices with * indicate lead iodide peaks, others are $CH_3NH_3PbI_3$. Arrows represent height of (001) lead iodide peak in hot plate annealed and IPL sintered perovskite samples.

It is thought that the perovskite structure should remain intact for the duration of the rapid high temperature pulse to enable high efficiency devices. To verify no structural changes were occurring, XRD patterns were used to analyze the crystal structures of $CH_3NH_3PbI_3$ deposited on a glass slide and processed via the hot plate annealing and the IPL process. FIG. 4 shows a side-by-side comparison of the XRD pattern of the perovskite solar cells under the two annealing methods.

The IPL samples have a higher degree of crystallinity shown by their more intense peaks and more importantly have the same pattern as the hot plate annealed samples. The IPL sintered samples do not show peaks signifying a decomposition to lead iodide. Furthermore, the diffraction peaks from the (110) planes of the tetragonal I4/mcm phase ((3 phase) of $CH_3NH_3PbI_3$ were observed at $2\theta=14.08°$ (d 6.26 Å), along with peaks at $2\theta=28.36°$ and $31.76°$ due to the (220) and (310) diffractions, respectively.

Figure 5A:
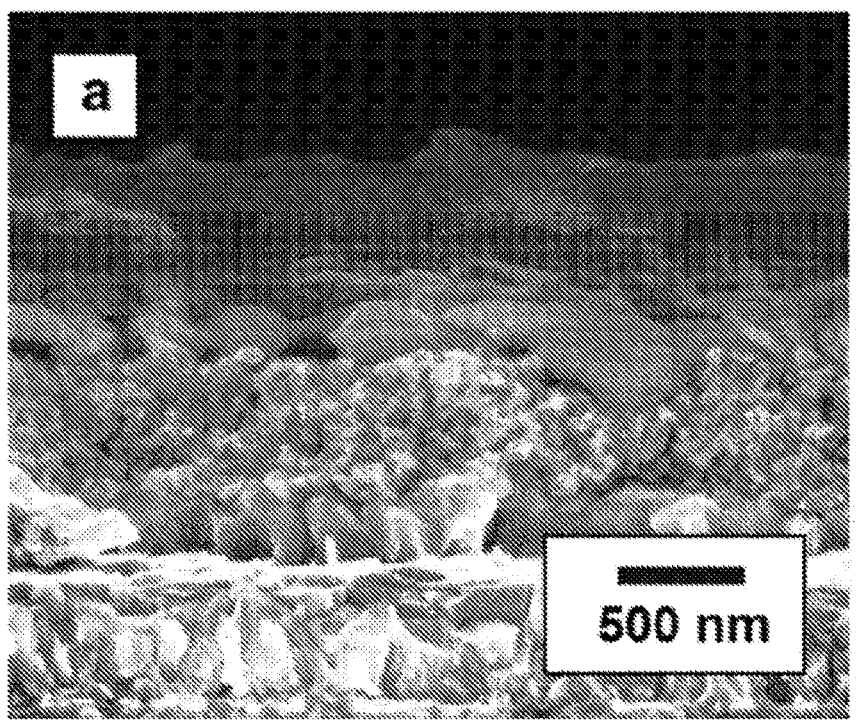
FIGS. 5A-5B show SEM cross-sectional images of perovskite after (FIG. 5A) hot plate annealing, and (FIG. 5B) IPL sintering. The colors green, magenta, cyan, and yellow correspond to Spiro-MeOTAD, Perovskite, $TiO_2$, and FTO respectively.
Figure 5B:
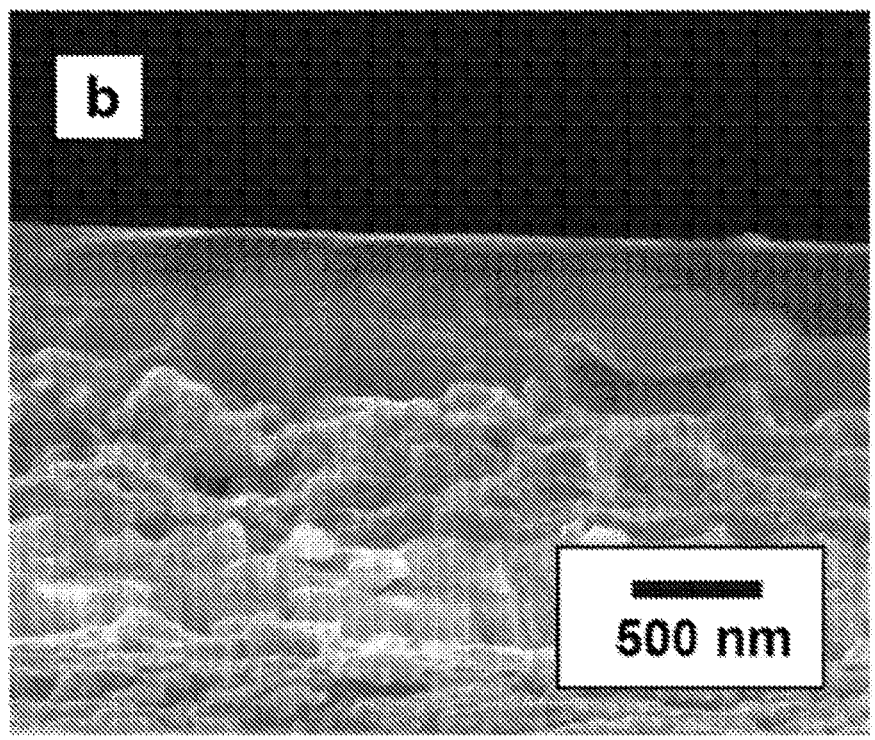

To create the larger and less porous morphologies, the IPL process sintered the particles together and filled in any voids in the film. This was evident from the cross-sectional SEM images (FIG. 5) that detailed a thinning of the perovskite layer during the IPL process. The pictures also illustrated that the IPL sintered samples have a smoother surface compared to the sample annealed on a hot plate and greater pore filling of the $CH_3NH_3PbI_3$ into the $TiO_2$ mesoporous layer. It should also be noted that the pore filling of the hot plate processed samples was limited, which will impact performance. The smoother surface of the Spiro-MeOTAD should make a better contact with the evaporated gold cathode and improve the performance of the solar cell by decreasing series resistance. Greater pore filling has been shown to be an important factor to control the completeness of perovskite coverage on the $TiO_2$ nanoparticles and reduce recombination rates. The lower recombination rates improve the charge transport rates and collection efficiencies of the solar cells.

Figure 6:
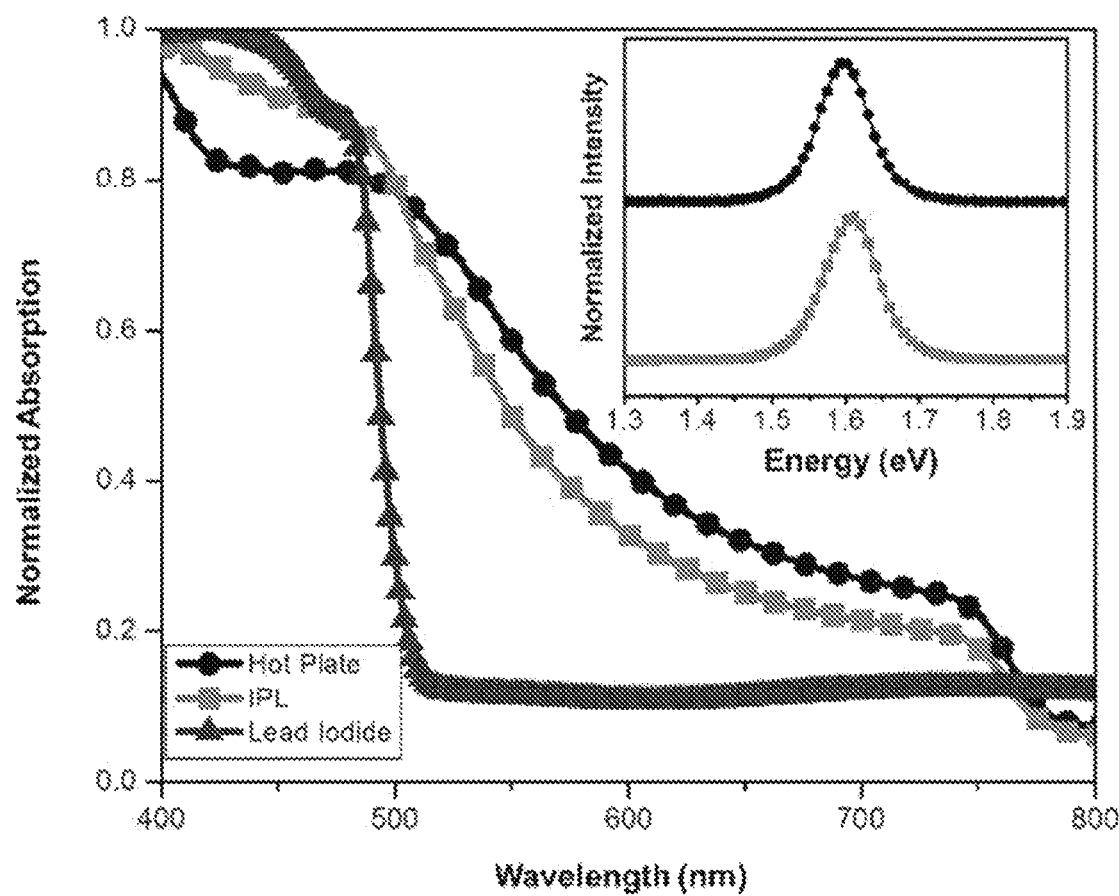
FIG. 6 shows a UV-Vis comparison of hot plate annealed perovskite, IPL sintered perovskite, and lead iodide. Inset image is the photoluminescence of hot plate annealed perovskite and IPL sintered perovskite.

UV-Vis spectroscopy data shown in FIG. 6 provided further evidence of a thinning of the perovskite layer. The IPL-treated samples are less absorptive compared to the hot plate treated samples. More importantly, the UV-Vis data supported the assertion that $PbI_2$, a known byproduct of the decomposition of $CH_3NH_3PbI_3$, is not being created during the IPL process. $PbI_2$ UV-Vis spectra shows a significant decrease in absorption at 500 nm, which is not seen in the IPL treated perovskite samples. Photoluminescence of the as-deposited perovskite and IPL processed perovskite in the inset of FIG. 6 also provided evidence of the perovskite structure remaining intact after sintering, and these yielded a band gap of 1.62 eV which is in agreement with previously reported values.

Figure 7:
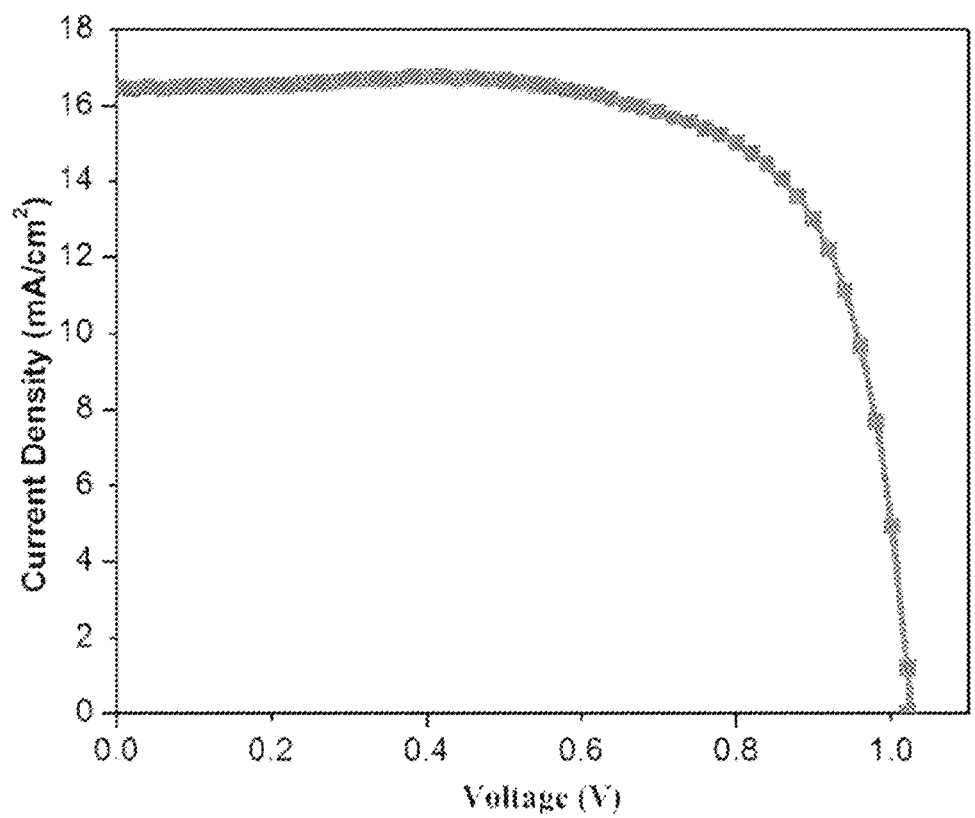
FIG. 7 shows a J-V curve of an IPL sintered perovskite solar cell under AM 1.5, 1 Sun intensity illumination.

With XRD and SEM evidence suggesting a higher crystalline perovskite film formation using IPL, the optoelectronic properties suggest that the IPL should have an improved performance over the thermally annealed cells. IPL perovskite solar cells were fabricated and tested using an AM 1.5 solar simulator. The JV curve in FIG. 7 depicts the best performance of the IPL solar cells created. A comparison of the average performances of the IPL processed and hot plate processed solar cells from the same batch is shown in Table 1. The IPL processed solar cells have a higher current density, open circuit voltage, and fill factor than the perovskite solar cell that was annealed using the conventional hot plate method. Additionally the IPL samples have less variability.

The higher current density values in the IPL sintered perovskite solar cells are likely due to the improved perovskite layer morphology and pore filling. Better coverage of the perovskite layer prevented the leakage of current through the cell and increased the shunt resistance, which in turn increased the current density. A more surprising result was the decrease in series resistance as seen by the difference in $V_{oc}$. As mentioned previously, the decrease was likely due to the smoothing of the perovskite film and the creation of a more intimate, less resistive series contact with the gold cathode.

All of the solar cells tested in the above-described work produced lower current densities than the highest efficiency perovskite solar cells reported in the literature. This reduced performance is primarily attributed to low performing Spiro-MeOTAD as the hole transport layer. Four point probe measurements of the Spiro-MeOTAD indicated a conductivity of $2.75 \times 10^{-5}$ S cm$^{-1}$, which is two orders of magnitude lower than the Spiro-MeOTAD used in the highest efficiency perovskite solar cells.

TABLE 1

The summary of average performance parameters of the solar cells ± one standard deviation.

| Heat Treatment | $J_{sc}$ (mA/cm$^2$) | $V_{oc}$ (V) | Fill Factor | PCE (%) |
| --- | --- | --- | --- | --- |
| Hot Plate | 13.05 ± 3.55 | 0.96 ± 0.031 | 0.66 ± 0.068 | 8.21 ± 2.38 |
| IPL | 16.55 ± 1.77 | 1.02 ± 0.032 | 0.69 ± 0.062 | 11.5 ± 0.62 |

In summary, photoactive perovskite layers were successfully sintered with a novel IPL treatment with efficiencies exceeding 12%. The processing time was reduced to 2 ms, which was significantly faster than previous reports. Additionally, the average performance of the IPL processed samples was an improvement to the hot plate processed samples, although the hot plate samples are not comparable to the state-of-the-art sequential deposited perovskite solar cells. However, all samples were produced within the same batch maintaining consistent processing with the exception of the thermal treatment. IPL enabled the sintering with 2 ms flashes from a Xe lamp, creating temperatures significantly exceeding the steady-state degradation temperature of 150° C. The perovskite particles displayed necking and then formed larger crystal grains after successfully covering the $TiO_2$ mesoporous layer. XRD, UV-Vis, and PL all verified that the crystal structure was maintained during the morphological change. This advance created a new method to quickly create dense layers of perovskite, eliminated the rate-limiting annealing step detrimental to industry adoption, and showed the first known occurrence of sintering in $CH_3NH_3PbI_3$ perovskite particles.

Example 2

Materials and Methods

Materials.

Unless stated otherwise, all the materials were used as-received without any further purification. Methylammoniumchloride (MACl), N,N-dimethylformamide (DMF), titanium diisopropoxide bis(acetylacetonate) (TAA) and Bis (trifluoromethane)sulfonimide lithium salt were purchased from Sigma-Aldrich. Leadiodide ($PbI_2$) was purchased from Alfa-Aesar, The 2,20,7,70-Tetrakis(N,N-di-p-methoxyphenylamine)-9,90-spirobifluorene (Spiro-MeOTAD) was purchased from Merck and polyvynylpyrollidone K15 was purchased from Spectrum Chemicals. Methylammonium iodide (MAI) and $TiO_2$ paste were purchased from Dyesol.

Etching and Cleaning.

FTO coated glass (2 cm×2 cm) was first etched using a zinc powder and 2 M HCl. Cleaning of the FTO coated glass was initiated by dipping in Hellmanex soap solution diluted by DI water in 1:10 vol % and sonicated for 10 min. Successively, the glass slides were sonicated for 10 minutes in DI water, ethanol and in DI water. Cleaned glass slides were blow dried with nitrogen. Cleaned glass slides were exposed to oxygen plasma for 10 minutes and successively, UV processed for 30 minutes before spin coating $TiO_2$ layers.

Preparation of $TiO_2$ Layers on Electrodes.

Hole blocking $TiO_2$ Layer was prepared by spin coating a 0.15 M titanium diisopropoxide bis(acetylacetonate) solution dispersed in anhydrous 1-butanol with spin rates set at 700 rpm for 8 s, 1000 rpm at 10 s, and then 2000 rpm for 40 s without stopping in between. The spin coated slides were heated on a hot plate at 120° C. for 5 min to remove the remaining solvent after spin coating. Mesoporous $TiO_2$ (mp-$TiO_2$) layer was spin coated at 3000 rpm for 60 s using a Dyesol 18NR-T $TiO_2$ paste diluted with ethanol in 1:4 ratio by weight. The slides were heated on a hot plate at 120° C. for 5 min to remove the remaining solvent before placing them in a furnace to sinter at 500° C. for 60 min. In the next step, slides with mp-$TiO_2$ layer were dipped in a 90 mM solution of $TiCl_4$ in 20% HCl diluted to 40 mM in DI water. The solution containing slides were heated in an oven at 70° C. for 30 min to fill the pores in mp-TiO2 layer. The slides were rinsed with water and heated at 500° C. for 30 min for the crystallization of $TiO_2$ from the $TiCl_4$ treatment. The final $TiO_2$ layer was treated with lithium salt by spin coating 0.1 M Bis(trifluoromethane)sulfonimide lithium salt in acetonitrile with a spin rate of 3000 rpm for 30 s and annealed at 450° C. for 30 min. The $TiCl_4$ and lithium treatments were performed for the slides used only in the device fabrication. All the optimization process of perovskite films was performed on only mp-$TiO_2$ films without $TiCl_4$ treatment.

Preparation of Perovskite Layer.

$PbI_2$ and MAC1 with 1:1 molar ratio were dissolved in DMF solvent with a total of 300 mg per mL and named this solution as non-PVP added solution. The other solution was prepared with same molar ratio with addition of 3.3 wt % (9.9 mg) of PVP to the precursor weight and named as PVP-added solution. It has been reported that PVP mixed perovskite compositions, among those 3.3 wt % of PVP mixed perovskite cells, showed better efficiency compared to other compositions. The $TiO_2$ deposited slides were placed on a hotplate at 100° C. and the precursor solution was kept at 70° C. The heated slide was quickly placed on a spin coater chuck and dropped heated solution, and spun at 2000 rpm for 10 s. This hot-deposition method was previously reported in which slides were heated at 180° C. and spin coated inside the nitrogen filled glove box. The spin coated perovskite layer was post-treated with a Xenon Sinteron 2000 Intense Pulse Light (IPL) system with an input energy density of 26.5 $mJ/cm^2$ and with different number of pulses with each pulse having 2 ms pulse duration. Some of the as-deposited slides were post-treated with a hotplate at 140° C. for 60 min.

Device Fabrication.

For the device fabrication, PVP-added and non-PVP added perovskite layers were post-treated with IPL processing of 26.5 $mJ/cm^2$ energy density and 5 pulses with each pulse having 2 ms duration. The spiro-MeOTAD layer was prepared by spin-coating at 1700 rpm for 30 min inside a nitrogen filled glovebox. The solution was prepared by dissolving a 72.3 mg of spiro-MeOTAD in 1 mL of chlorobenzene along with a 28.8 μL 4-tert-butyl-pyridine, a 17.5 μL portion of stock solution of 520 mg/mL lithium bis (trifluoromethylsulfonyl) imide in anhydrous acetonitrile and a 29 μL of Dyesol cobalt dopant FK209 TFSI salt with concentration of 300 mg/mL in anhydrous acetonitrile. Finally, 100-nm-thick Au electrode was deposited via thermal evaporation.

Device Characterization.

X-Ray diffraction (XRD) studies were carried out using a Bruker AXS D8 X-ray diffractometer with a scan rate of 0.3 s/step and a step size of 0.02°. Microstructure of the films was characterized using an FEI Nova NanoSEM 600 with an accelerating voltage of 5 kV and a working distance of 5 mm. The J-V characteristics of the devices was performed using an AM 1.5 simulated light from a Newport LCS-100 system and a Metrohm's Autolab potentiostat. UV-Visible spectroscopy was carried on the perovskite layer using a Perkin Elmer Lambda 950 spectrometer.

Results and Discussion

The perovskite film deposition and post-sintering process was carried-out outside the nitrogen filled glove box in an effort to improve the scalability of the manufacturing process. In addition, a one-step deposition method without the use of secondary solvents for solvent-solvent extraction was chosen. In an effort to fabricate perovskite solar cells in ambient conditions, MAC1 was used as the methyl-ammonium precursor chemistry. Chlorine assists in improving crystallization process and provides longer diffusion lengths for charge carriers in the mixed perovskite films. DMF was preferentially chosen over dimethyl sulfoxide (DMSO) solvent to mix the perovskite precursors due to its lower boiling point compared to DMSO. DMSO has proven to assist in obtaining better surface coverage of the film by forming intermediate complexes with precursor materials. However, for the deposition of the perovskite film without solvent-solvent extraction process, DMF would be a better choice than DMSO to evaporate the solvent at lower temperature and initiate nucleation process for forming the perovskite crystals.

Figure 8A:
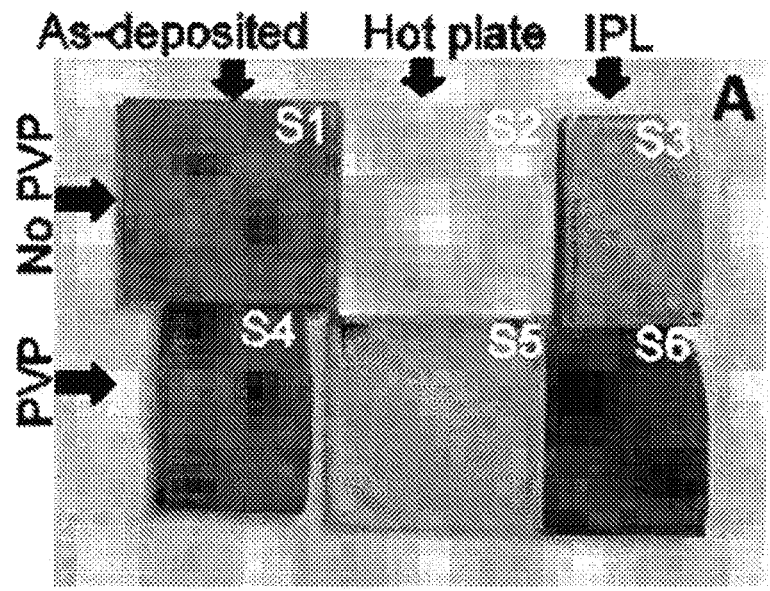
FIGS. 8A-8B show perovskite layer formation on mp-$TiO_2$ layer with different post-treated conditions.
Figure 8B:
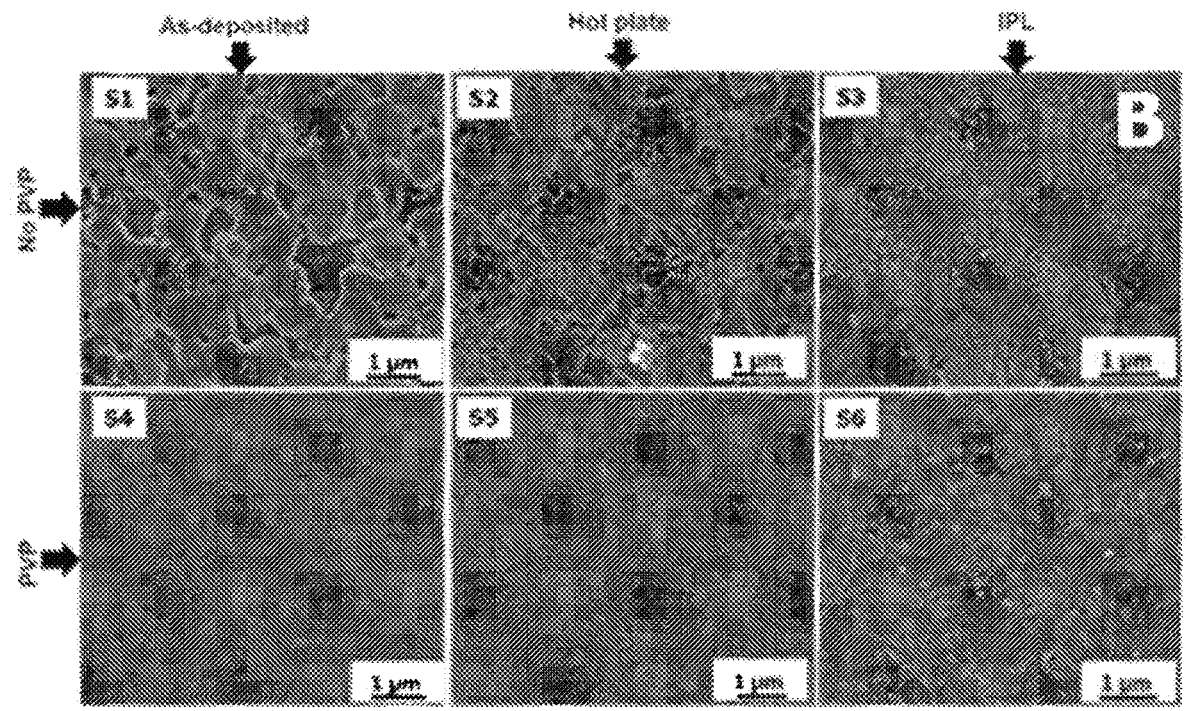

Utilizing standard spin coating techniques at ambient conditions and the precursors used in this study resulted in a film that is white and fairly transparent. The optical absorption of these films was very low and so sufficient energy to impart a thermal rise cannot be absorbed into the films. A deposition technique called hot casting involves the spin coating of the precursor chemistries onto a substrate preheated to 160-180° C. The increased temperature of the substrate enhances the evaporation of the solvent leading to the formation of the perovskite crystal and at these high temperatures resulted in very large grains. Thus in order to initiate the nucleation of the perovskite material, the films were deposited on substrates at 100° C. in an otherwise uncontrolled environment. The hot-cast deposited films were dark brown in color (FIG. 8A-S1) and are optically absorbing thus suitable for IPL processing. However, these films exhibited very poor surface coverage as shown in the SEM image (FIG. 8B). Annealing these films on a hot plate, to improve the crystallinity and surface coverage, resulted in a yellow film indicating that the perovskite had decomposed into its $PbI_2$ form (FIG. 8A-S2).

As described herein, the IPL process can be used to improve the grain size of the perovskite films. Here onwards, the hot-cast deposited films are called as-deposited films. The as-deposited films were processed with 20 pulses of 25.6 $J/cm^2$ energy with a pulse duration of 2 ms. The IPL treated samples showed very similar color to the as-deposited films (FIG. 8A-S3). The IPL treated samples also exhibited larger grains without clear grain boundary separation compared to the only as-deposited films (FIG. 8B-S3). Each grain consisted of multiple small grains which indicated the polycrystallinity within a single grain.

To probe whether the perovskite film was formed with two different processes (hot plate and IPL), XRD analysis was carried-out on just as-deposited, hot plate treated and IPL processed films. The XRD spectra (FIG. 9) revealed that the as-deposited films (S1) exhibited a small perovskite peak at 14.08° and no $PbI_2$ peak at 12.60°. For the films post-treated with the hot plate, the perovskite peak was not evident and $PbI_2$ peak was clearly present. This was also supported by the color of the film (FIG. 8-S2). The IPL treated films had an increased perovskite peak intensity; however, the films also showed the onset of a small $PbI_2$ peak. IPL has also proven its potential in sintering other various environment sensitive films used for photovoltaic and printed electronic applications. Peaks at 14.08° and 28.30° represent the (110) and (220) peaks of perovskite crystal in tetragonal phase based on previously reported data. The reaction mechanism and the intermediate complexes during the annealing process for the chlorine-based mixed perovskite system was reported elsewhere. In addition, there were peaks at 15.60° and 37.74° which represented the $MAPbCl_3$ formation. It also revealed that the IPL treated samples possessed a physical mixture of phase-segregated $MAPbI_3$ and $MAPbCl_3$ perovskite crystals. Change in the perovskite crystal structure from $MAPbI_3$ to $MAPbCl_3$ or vice-versa with the change in the annealing conditions has been observed elsewhere. Perovskite crystal formation and grain growth with the rapid annealing IPL process was rather complex, especially involving a mixed halide system, although it appeared to involve a synergistic relationship between the IPL process and perovskite formation.

In an effort to improve the surface coverage of the perovskite films, PVP was added as an additive/binder to the precursor solution. PVP and other additives were reported to improve the surface coverage of the perovskite films and efficiencies of the perovskite solar cells. In addition, there have been reports of deposited PVP mixed perovskite materials and cured at 140° C. for 50 min inside a nitrogen filled glove box. FIG. 8A-S4, S5, and S6 show the as-deposited, hot plate annealed and IPL processed perovskite films deposited with a PVP additive as a binder to the precursor solution, respectively. The as-deposited PVP added films were light brown in color whereas, successive hot plate annealed films turned yellow and IPL processed films were darker brown in color. The PVP-added films showed superior film coverage compared to the non-PVP added films (FIG. 8B-S1-S3). The hot plate annealed PVP-added films formed $PbI_2$ which prevented further consideration of these films for optimization process (FIG. 8B-S5). In case of the IPL treated PVP-added films, excellent film coverage with clearly defined grain boundaries was observed (FIG. 8B-S6). This superior coverage of the films confirmed that the PVP was playing a critical role in crystal formation and growth with IPL processing.

Figure 9:
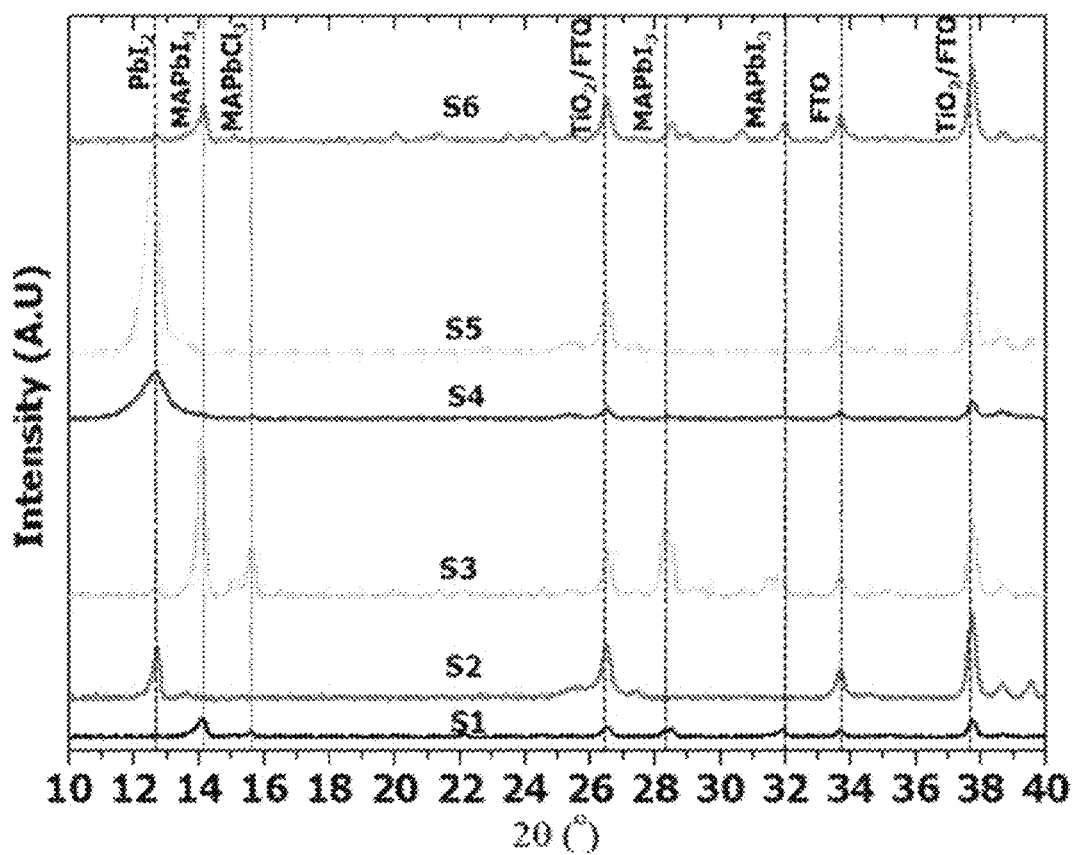
FIG. 9 shows XRD analysis of different post-annealed perovskite films. S1 and S4 are as-deposited films with non-PVP and PVP inclusion, respectively; S2 and S5 are hot plated cured perovskite films with non-PVP and PVP inclusion, respectively; S3 and S6 are IPL processed perovskite films with non-PVP and PVP inclusion, respectively.

The XRD spectra from the PVP-added films is shown in FIG. 9. Surprisingly, as-deposited PVP added films showed a 12.60° peak which corresponded to $PbI_2$ formation. This indicated that PVP was hindering the rapid perovskite crystal formation. The hot-plate annealed PVP added films also clearly exhibited the $PbI_2$ peak. Interestingly, the IPL treated PVP added samples with the same input parameters used for non-PVP added samples showed no $PbI_2$ peak and the films turned dark brown in color. The $PbI_2$ peak from the as-deposited films disappeared and a new peak was originated at 14.08° which represented perovskite crystal formation. However, peak intensity was much lower than the non-PVP added IPL treated samples (FIG. 9). This indicated that the PVP was influencing the crystal formation. The peak originated from the $MAPbCl_3$ (15.7° in non-PVP added films was substantially suppressed in the PVP-added films which indicated that the PVP might be assisting in forming mixed halide perovskite by binding nucleation sites closer together.

Figure 10A:
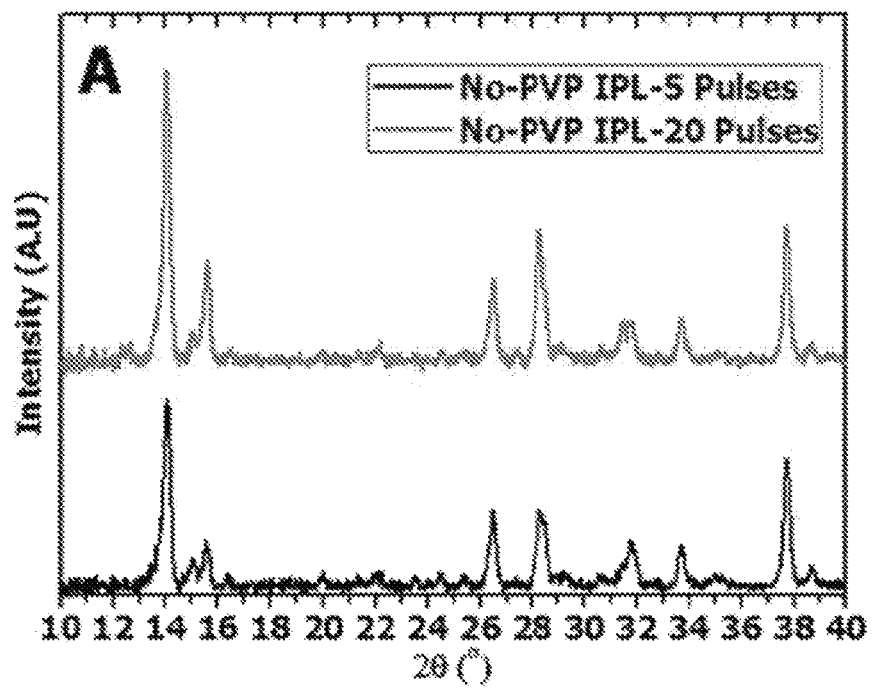
FIGS. 10A-10B show XRD spectra of (FIG. 10A) no-PVP-added and (FIG. 10B) PVP-added films processed with different IPL conditions.
Figure 10B:
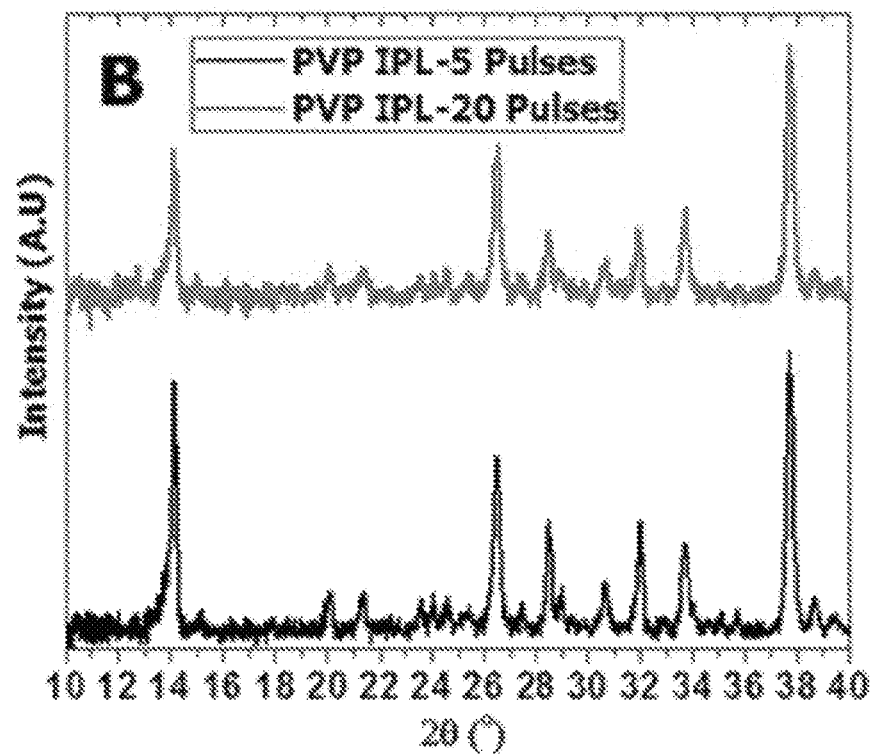
Figure 11A:
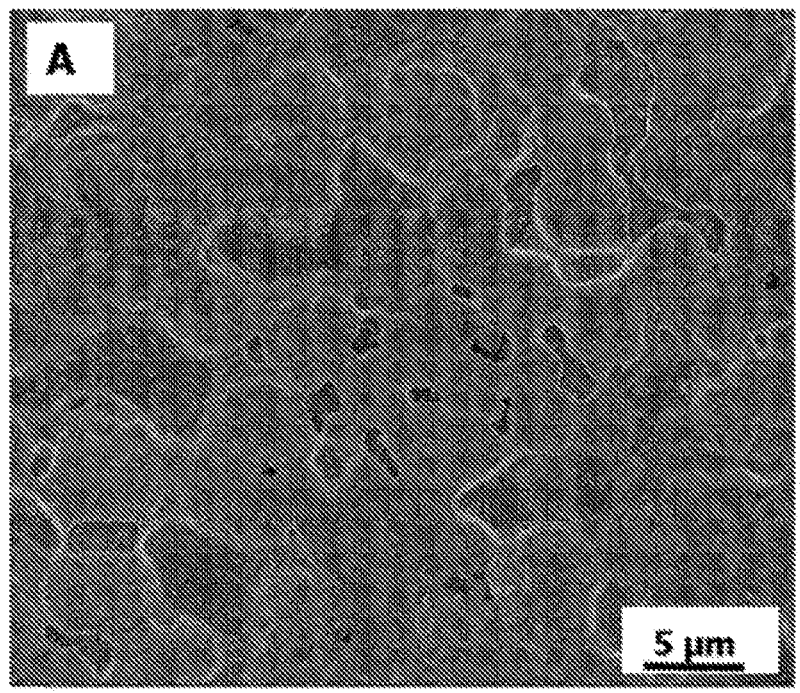
FIGS. 11A-11D show surface morphology of non-PVP-added and PVP-added films processed with different IPL pulses at 2 ms pulse duration and 26.5 mJ/$cm^2$ energy density.
Figure 11B:
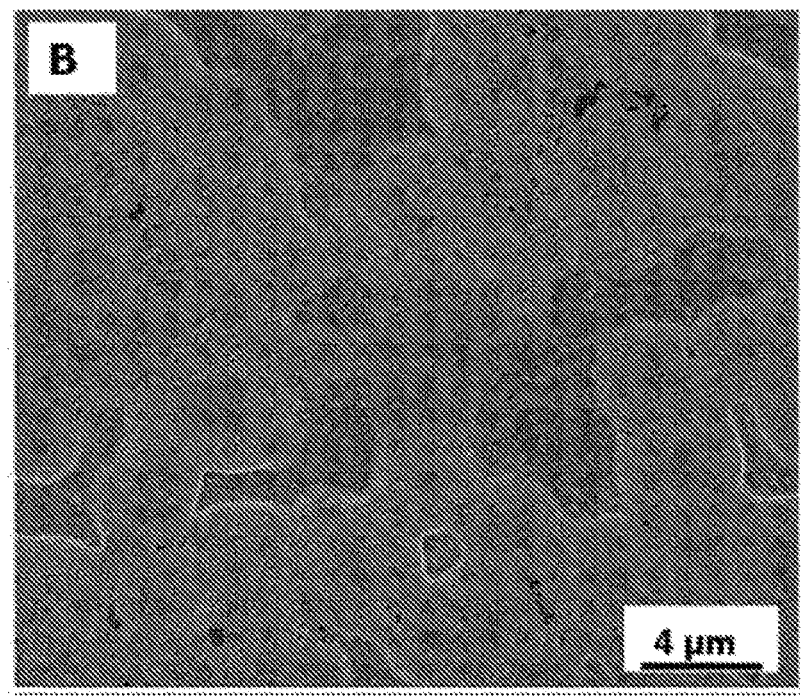
Figure 11C:
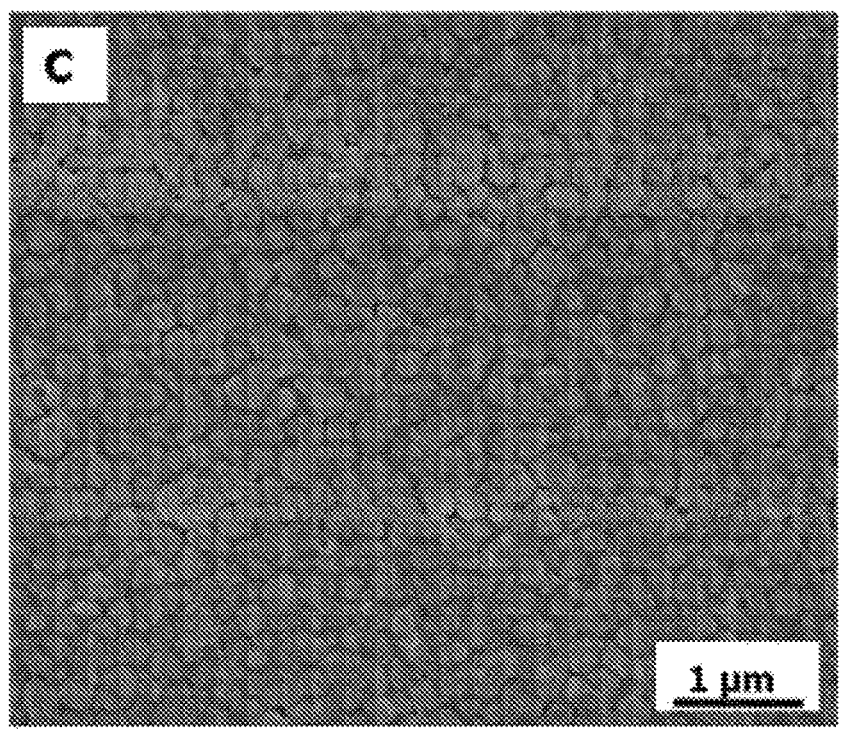
Figure 11D:
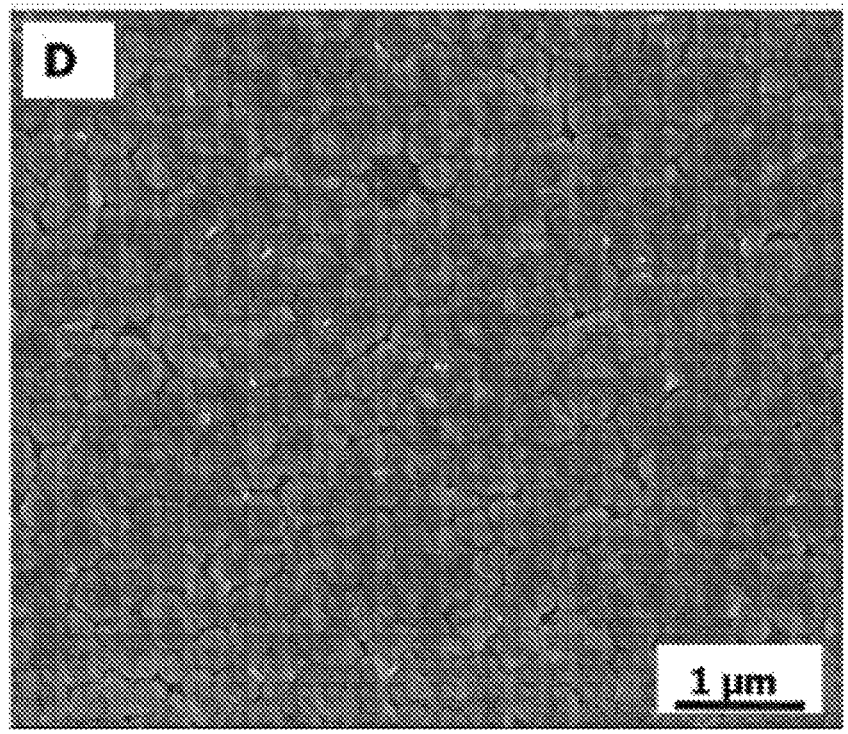

To understand the role of IPL input energy on the formation of perovskite films, one set of as-deposited films were processed with 5 pulses and the other set of films processed with 20 pulses. The duration of each pulse was 2 ms and the energy density of 25.6 J/cm² at a pulse frequency of 1 Hz. The PVP-added samples processed with 20 pulses showed decreased peak intensity compared to the corresponding peaks from the samples with five pulses (FIG. 10B). Whereas, non-PVP-added samples showed increased peak intensity with increasing number of pulses (FIG. 10A). The surface morphology of the non-PVP added films showed similar coverage for 5 and 20 pulses, but formed better connected grains with significant uncovered area after 20 pulses (FIGS. 11A-D). The films undergoing 20 pulses showed much more white crystallites compared to dark crystallites in the film (FIGS. 11A-D). This could be attributed to the physical mixture of phase segregated $MAPbI_3$ and $MAPbCl_3$, and XRD confirmed the increase in the $MAPbCl_3$)(15.60° peak. In case of PVP-added films, perovskite peak intensity decreased with increased number of pulses. Accordingly, there was believed to be a synergistic relation between PVP, perovskite crystals and light energy.

Figure 12:
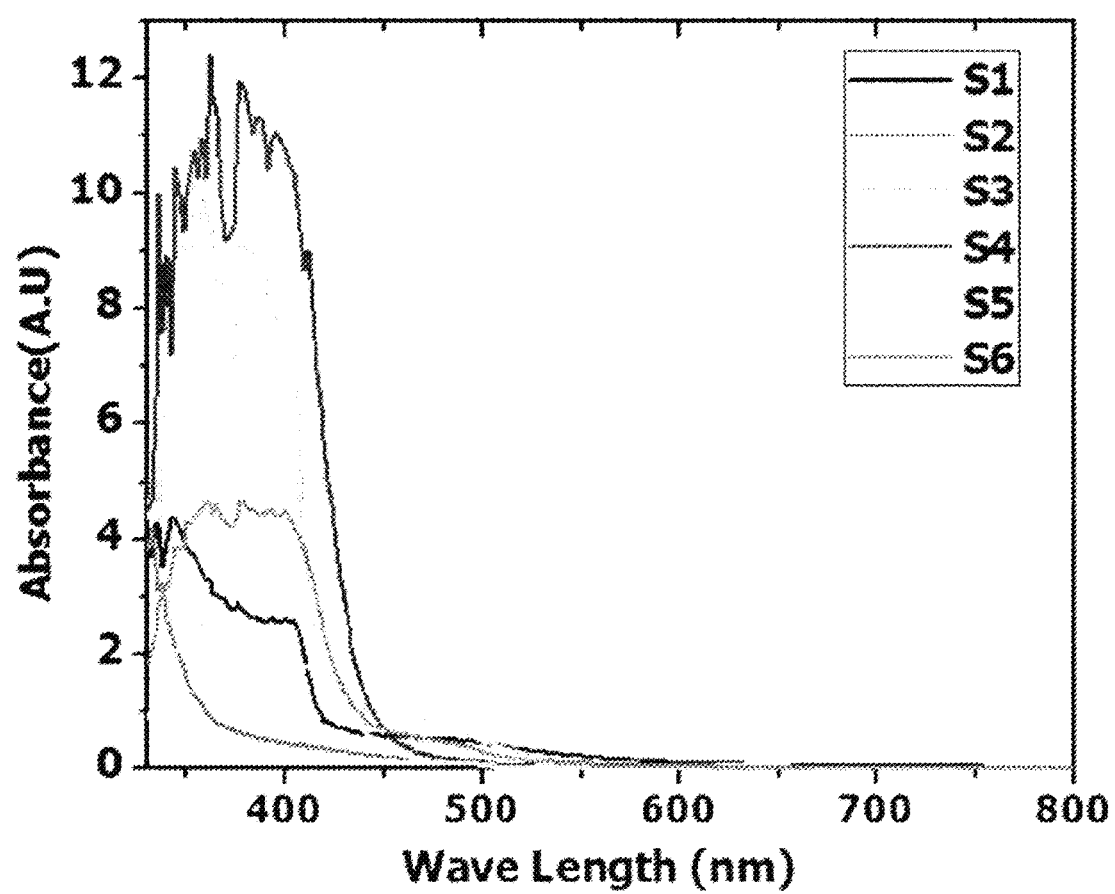
FIG. 12 shows UV-Visible absorption spectroscopy for the perovskite films treated with IPL energy density of 26.5 mJ/$cm^2$ and 2 ms pulse duration.

In addition to surface morphology, light absorption behavior of the non-PVP-added and PVP-added perovskite films was investigated (FIG. 12). Most of the absorption from all the films was sharply decreased above 450 nm. In case of non-PVP added samples, higher absorption was noticed for the IPL processed samples compared to the as-deposited films. This increase in the absorption could be attributed to the better surface coverage and crystallinity of the IPL treated samples over the as-deposited samples. Interestingly, the absorption was decreased significantly for the IPL processed PVP-added films compared to the as-deposited PVP added films. This decrease in the absorption for the IPL processed samples could be due to decomposition of PVP with the IPL sintering, causing thickness reduction of the film and better surface coverage of the perovskite film. The absorption band edge for pure $MAPbCl_3$ would be below 450 nm whereas for pure $MAPbI_3$, it would be above 800 nm. The absorption band edge for the perovskite films was around 450 nm to 500 nm which suggested the formation of mixed halide perovskite with mostly chloride domination. This narrow bandgap is a limitation to the amount of current that can be generated, although it could be useful for LEDs.

Figure 13A:
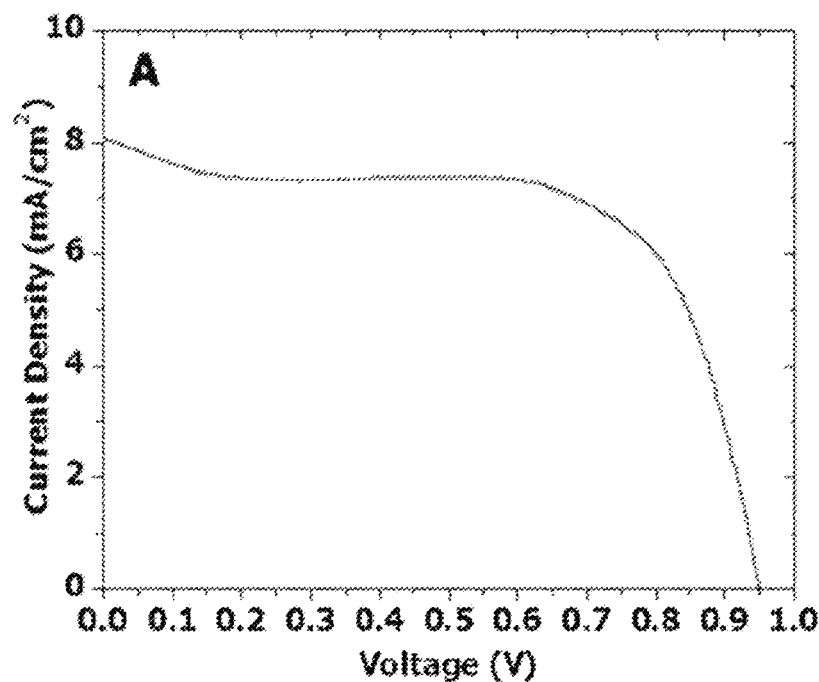
FIGS. 13A-13B show J-V curves for the perovskite cells from (FIG. 13A) Non-PVP added devices and (FIG. 13B) PVP-added devices.
Figure 13B:
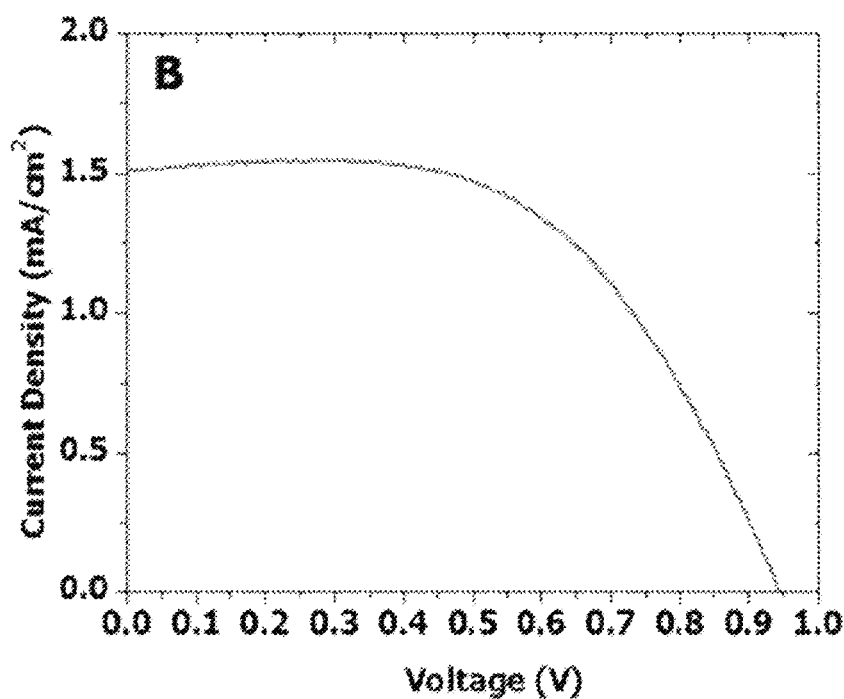

To demonstrate a working solar cell, devices were fabricated using formulations with non-PVP and PVP inclusion as mentioned in the method section. Since the IPL processing conditions of 5 pulses with each pulse having 2 ms duration and 25.6 J/cm² energy density yielded a better surface coverage and better perovskite XRD peak intensities for PVP added samples, these IPL input parameters were chosen for the post-treatment of the perovskite films. FIGS. 13A-B show the J-V characteristics from non-PVP added and PVP added devices. The non-PVP added devices exhibited higher efficiencies ($J_{sc}$=7.65 mA/cm², $V_{oc}$=0.94 V, FF=0.62, PCE=4.6%) compared to the PVP added devices ($J_{sc}$=1.87 mA/cm$^2$, $V_{oc}$=0.95 V, FF=0.59, PCE=1.0%) based on the average from three devices measured in the reverse bias at a scan rate of 10 mVs$^{-1}$. These lower efficiencies in the PVP added films compared to the non-PVP added films could be attributed to the remnant organic content between grain boundaries which can prevent charge transfer to the electrodes. Even though device efficiencies were poor, the perovskite films were processed under ambient conditions and substantially reduced the post-sintering process to less than a minute using the scalable IPL processing technique. Further optimization of the perovskite precursor composition and additives might enable the fabrication of higher efficiency perovskite solar cells.

Discussion

The foregoing study explored the synergistic relation between the ink formulation and IPL method for the perovskite film formation in less than a minute under ambient conditions. Perovskite films annealed with a conventional hot plate were degraded and formed lead iodide. However, the films annealed with IPL technique formed perovskite crystals without lead iodide formation. PVP was used as a surfactant to improve the surface coverage of the films. The PVP added films showed significant improvement in the film coverage compared to the non-PVP added films. Nevertheless, non-PVP added films exhibited higher efficiencies compared to PVP added films. Further optimization of precursor composition and IPL processing conditions would enable the fabrication of higher efficiency perovskite solar cells under ambient conditions with substantially reduced post processing period.

Example 3

Materials and Methods

Depositing $CH_3NH_3PbI_3$ Films.

To establish the process for depositing $CH_3NH_3PbI_3$ films, a spin coater was retrofitted with a dry air inlet to reduce the humidity in the spin coater chamber to below 10%. The precursor formulation included DMF and DMSO, as well as the diiodomethane ($CH_2I_2$) additive to the $PbI_2$ and a methyl-ammonium precursor chemistry. As discussed in more detail below, the $CH_2I_2$ concentration was varied in order to find the optimal concentration for influencing halide vacancies.

Evaporation.

After the spin coating step, the perovskite layer was a transparent film which is not ideal for IPL annealing (in which white light must be absorbed to initiate thermal annealing). Accordingly, the films were placed on a hotplate at 75° C. for 2 min under ambient conditions to initiate the nucleation process. The films turned to brownish in color from transparent and thus were appropriate for the IPL process.

IPL Process—

The IPL step was accomplished using a Sinteron 2000 by Xenon Corporation. This equipment features a halogen lamp that can deliver up to 36 J cm$^{-2}$ over a 60 cm$^2$ area during the 1-2 ms flash. According to current embodiments, the films were exposed to five flashes each having a duration of 2 milliseconds with an energy density of 25 J cm$^{-2}$ per flash. The films were in the IPL apparatus without humidity controls. As discussed in more detail below, the number of pulses was also varied (while holding the energy density constant) in order to find the optimal process parameter.

Results and Discussion

As described in further detail below, high efficiency perovskite solar cells were successfully fabricated by adding a light sensitive alkyl halide as an additive to the MAI and $PBI_2$ ink chemistry and annealing the films rapidly using IPL technique under ambient conditions. It is believed that this IPL technique has the potential to anneal perovskite material at speeds of several square meters per second in ambient conditions. The interaction of the IPL process and the alkyl halide additive were explored using scanning electron microscopy, X-ray diffraction, electroimpedance spectroscopy, and concluded with an optimization of the IPL conditions and $CH_2I_2$ concentration.

Figure 14:
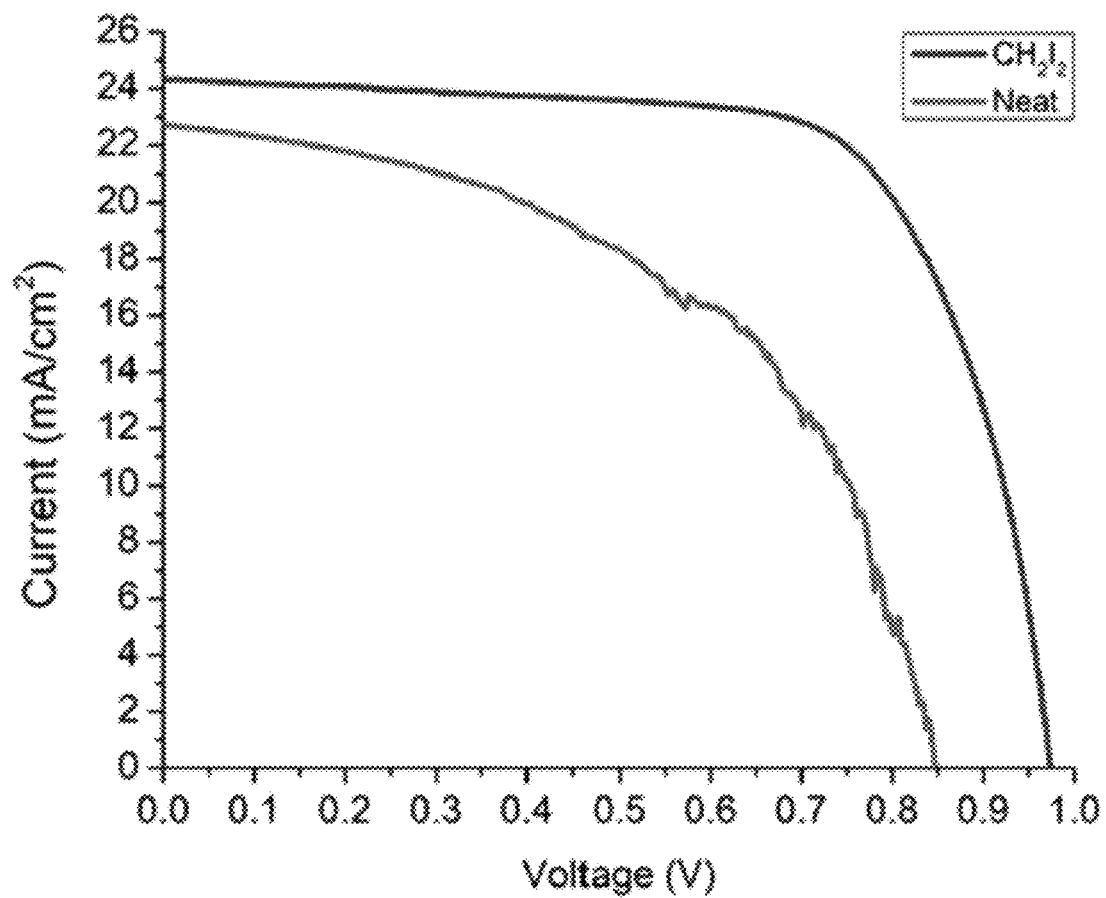
FIG. 14 shows J-V curves of neat perovskite cells and perovskite cells in which the alkyl halide, $CH_2I_2$, has been added to the MAI and $PBI_2$ ink chemistry.

As shown in FIG. 14, the IPL processing of the neat perovskite cells yielded a device with an efficiency of 10%. The addition of the $CH_2I_2$ to the formulation and processing using the IPL significantly improved the overall performance of the device to 16.5% (see FIG. 14). As shown in Table 2 below, the short circuit current density ($J_{sc}$), open circuit voltage ($V_{oc}$), and fill factor (FF) each saw a large improvement with the addition of the $CH_2I_2$. The champion cell exhibited a power conversion efficiency (PCE) of 16.5%, FF of 69.6, $V_{oc}$ of 0.97 V and $J_{sc}$ of 24.3 mA cm$^{-2}$, and the average performance of the 10 $CH_2I_2$ perovskite cells are shown in Table 2.

TABLE 2

Average performance of neat and $CH_2I_2$ perovskite solar cells (neat - 5 samples, $CH_2I_2$—10 samples) ± one standard deviation.

| | $J_{sc}$ (mA/cm$^2$) | $V_{oc}$ (V) | Fill Factor | PCE (%) |
|---|---|---|---|---|
| Neat | 21.7 ± 2.9 | 0.84 ± 0.03 | 44.4 ± 06.2 | 8.0 ± 1.4 |
| $CH_2I_2$ | 23.7 ± 0.7 | 0.99 ± 0.03 | 65.1 ± 3.0 | 15.3 ± 1.4 |

Figure 15:
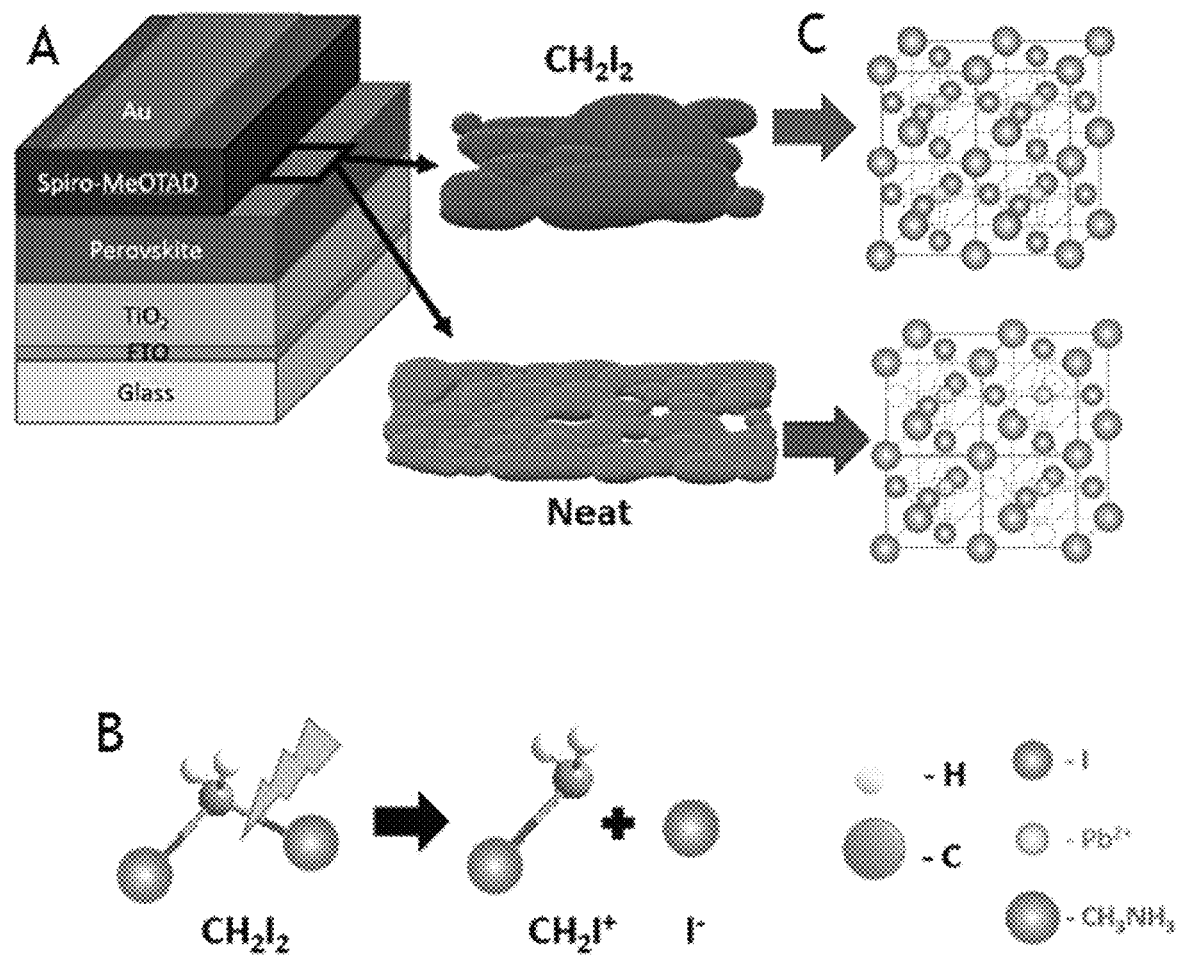
FIG. 15 shows a schematic explanation of the improved photovoltaic performance from the $CH_2I_2$ additive to the perovskite cells.

Based on the results, the $CH_2I_2$ likely plays multiple roles in the initial deposition of the films and the post processing of the films with the IPL technique. FIG. 15 provides a schematic explanation of the improved results from the addition of the $CH_2I_2$ in the perovskite solar cell, which lead to the improved photovoltaic performance (see FIG. 14 and Table 2). In short, the alkyl halide improves the solvent-precursor interaction which promotes quality and coverage of the $CH_3NH_3PbI_3$ films. FIG. 15 (panel A) illustrates the structure of the perovskite solar cell wherein the perovskite is located between a TiO2 hole blocking layer and a Spiro-MeOTAD hole transport layer. As shown in FIG. 15 (panel B), the IPL cleaves the $CH_2I_2$ thereby releasing an iodide ion. FIG. 15 (panel C) illustrates how the disassociated iodide ions fill the iodide vacancies and participate in the perovskite crystal formation, thereby improving the surface coverage of the solar cell and the conductivity of the film.

Figure 16A:
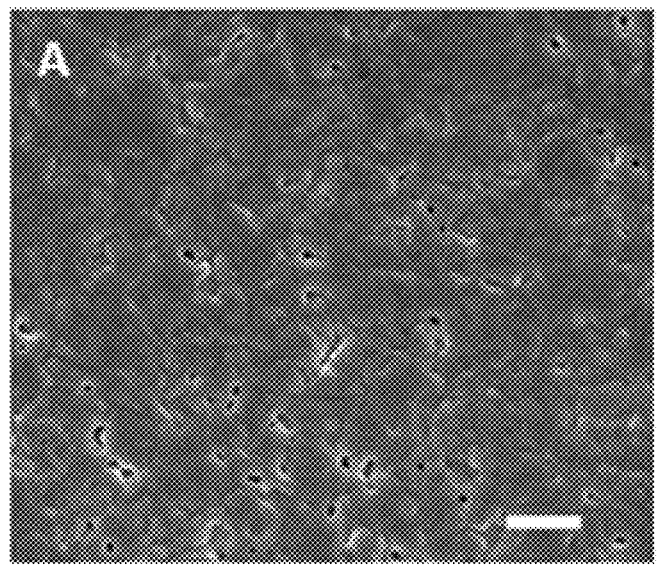
FIGS. 16A-16B shows surface morphology of (A) neat films (i.e. without the $CH_2I_2$ additive) and (B) a pinhole free surface from the addition $CH_2I_2$.
Figure 16B:
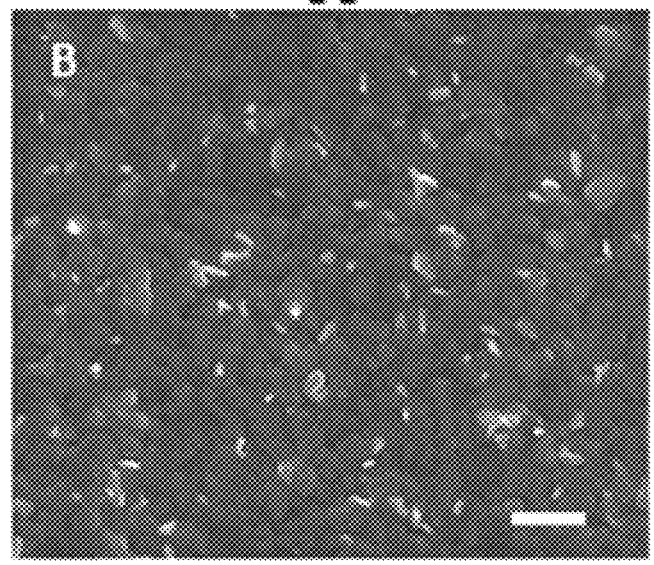

As shown in the scanning electronic microscope image of the neat cells in FIG. 16A, the low performance of the neat cells can be attributed to the poor morphology and numerous pin-holes of the surface. On the other hand, the addition of the $CH_2I_2$ influenced the crystal growth by controlling the grain growth and allowing the solute-solvent interaction to obtain a pin hole free perovskite film formation as shown in FIG. 16B.

Figure 19:
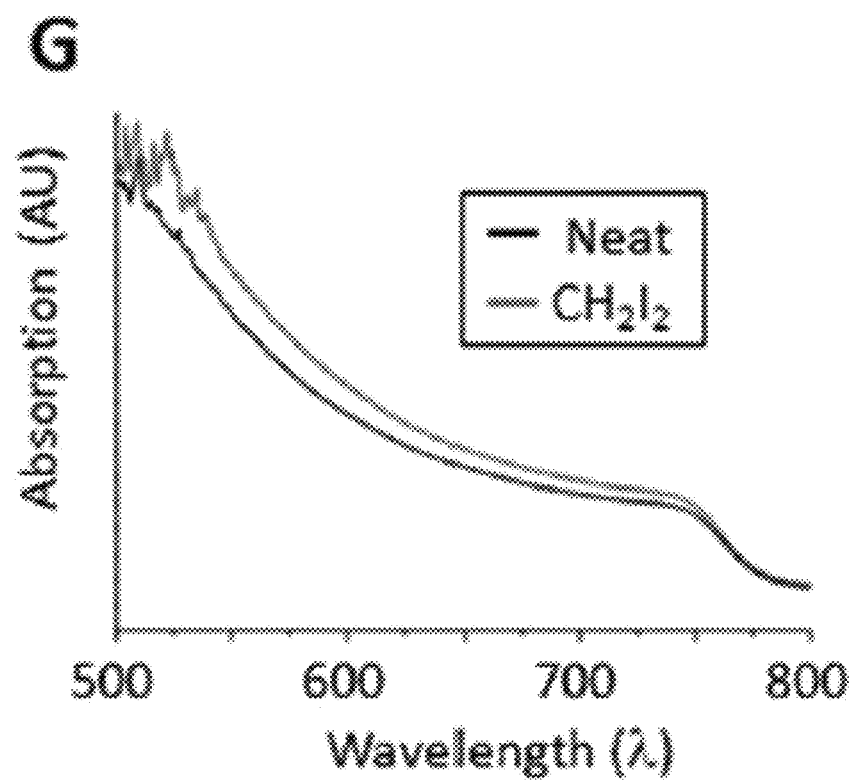
FIG. 19 shows the UV-vis absorption of the neat and $CH_2I_2$ films.
Figure 20A:
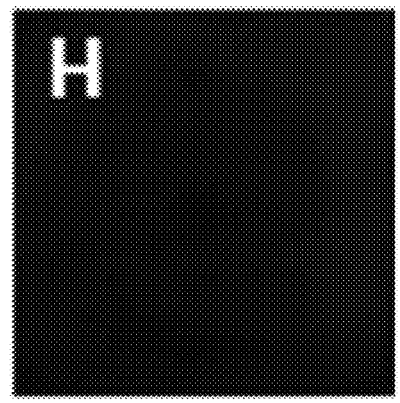
FIGS. 20A-20B show (H) the hazy diffuse reflectance from the surface of the neat film and (I) the homogenous and smooth surface of the $CH_2I_2$ films.
Figure 20B:
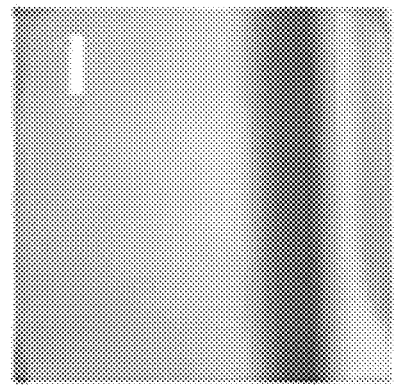

Both neat and $CH_2I_2$ films were brownish in color. Also, the UV-vis absorption of the films illustrated in FIG. 19 indicates that the absorbance of the two films are very similar across the visible wavelengths. However, it was observed that the neat films were hazy producing a diffuse reflectance from the surface (FIG. 20A). On the other hand, the $CH_2I_2$ films photographed in FIG. 20B were clear and exhibited a specular reflectance. FIGS. 20A and 20B indicate that the $CH_2I_2$ films were more homogenous and smooth than the neat films.

Figure 17A:
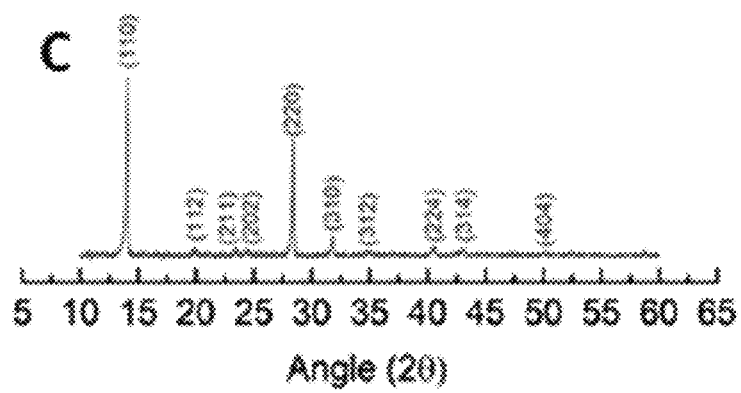
FIG. 17A shows the X-ray diffraction (XRD) pattern of neat films with no obvious degradation.
Figure 17B:
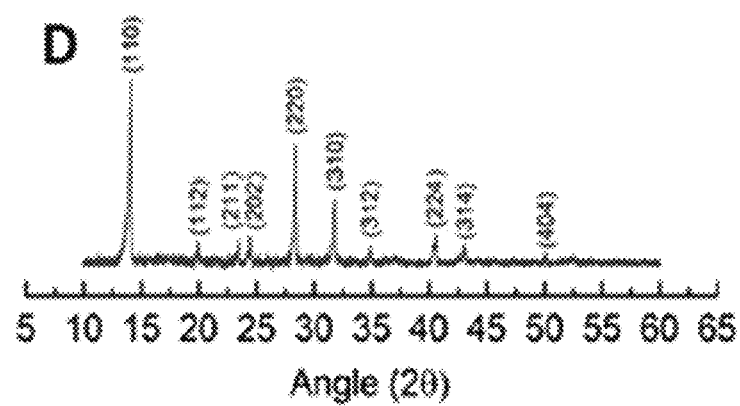
FIG. 17B shows the XRD pattern of perovskite films formed with the $CH_2I_2$ additive with no obvious degradation.

To investigate the role of the $CH_2I_2$ additive on the film crystallinity, the neat and $CH_2I_2$ films were analyzed by XRD. FIG. 17A shows the XRD analysis of the neat films and FIG. 17B shows the XRD analysis of the $CH_2I_2$ films. These results indicate that despite the high temperatures experienced by the film during IPL processing pure perovskite films were produced with no lead iodide formation as the major lead iodide peak at 12.6° was absent in the films. The diffraction peaks at 14.06°, 19.9°, 23.4°, 24.4°, 28.4°, 31.8°, 34.9°, 40.5°, 43° and 50.5° which were assigned to (110), (112), (211), (202), (220), (310), (312), (224), (314) and (404) crystal planes, respectively, indicate the perovskite was formed in tetragonal crystal structure. In addition, the intense peaks at the (110) and (220) crystal plans imply the formation of highly uniform and oriented perovskite structures.

Figure 18A:
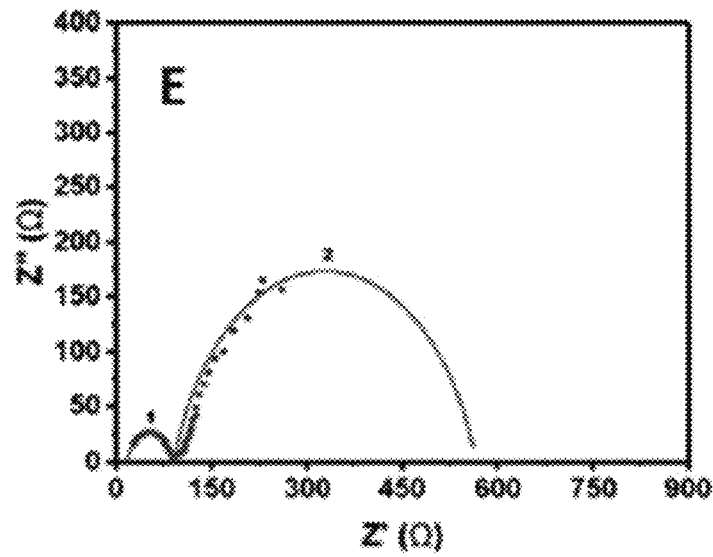
FIG. 18A shows the electroimpedance spectroscopy (EIS) scan of neat films.
Figure 18B:
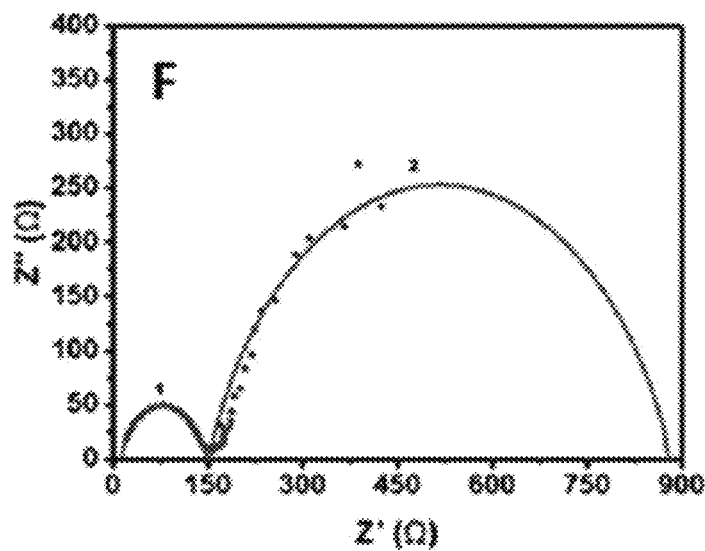
FIG. 18B shows the EIS scan of $CH_2I_2$ films.

To better understand the improved perovskite solar cell performance by the addition of the $CH_2I_2$ additive with IPL treatment, neat (FIG. 18A) and $CH_2I_2$ films (FIG. 18B) were compared using electroimpedance spectroscopy (EIS). The neat and $CH_2I_2$ cells were held at a potential near their respective open circuit voltages and the frequency was swept from $\sim 1 \times 10^6$ Hz to $\sim 0.01$ Hz. At high frequencies, one typically expects impedance signals indicative of series resistance within the cell. Signal 1 in FIG. 18A (the neat cells) is smaller than signal 1 in FIG. 18B (the $CH_2I_2$ cells), which suggests there is less series resistance in the neat cells than the $CH_2I_2$ cells. This would seem to suggest that the neat perovskite cell would perform better than the $CH_2I_2$ cells. However, the change in resistance is negligible and the dominant effect is due to the change in the recombination resistance. The low frequency region of the EIS plot is indicative of recombination resistance within the perovskite material. Recombination within a solar cell is detrimental to performance; therefore, an increase in recombination resistance is expected to improve the performance of the cell. Signal 2 in FIG. 18A (neat cell) is smaller than signal 2 in FIG. 18B ($CH_2I_2$ cell), which suggest that the neat perovskite cell has lower recombination resistance than the $CH_2I_2$ cell. Accordingly, the $CH_2I_2$ additive in combination with the IPL process improved the recombination resistance which indicates that these modifications to the precursor chemistry are the source of the performance increase.

Figure 21A:
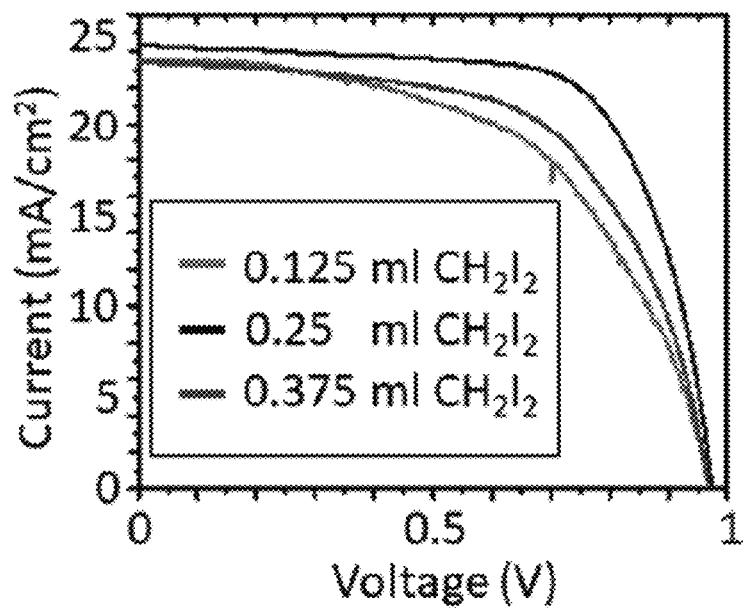
FIGS. 21A-21B show J-V curves of varying the concentration of the $CH_2I_2$ additive and varying the total number of pulses.
Figure 21B:
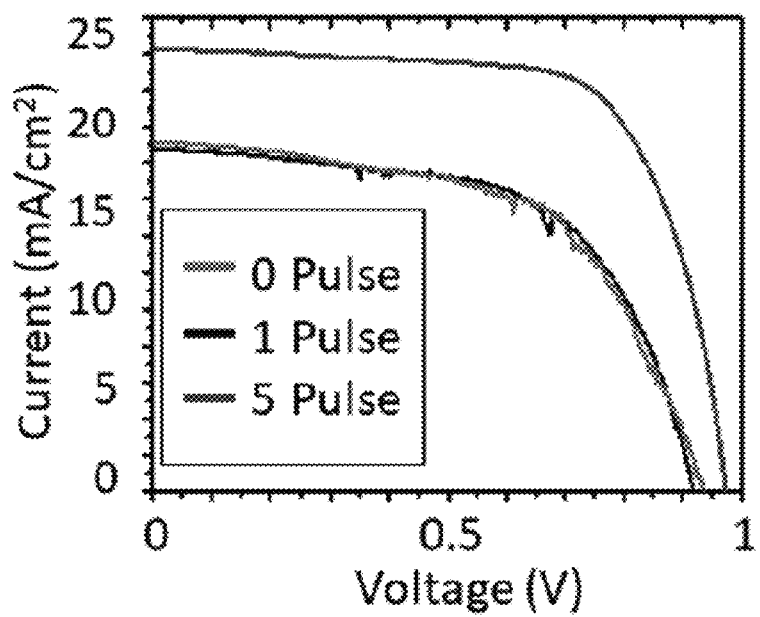

The C—I bond in $CH_2I_2$ possesses 50 kcal mol$^{-1}$ which can be cleaved by light and/or thermal energy. IPL provides optimum conditions to cleave the C—I bonds because it provides UV as well as thermal energy. Furthermore, IPL equipment can be tuned to energies from the UV to the NIR. To confirm the disassociation of the iodide ions from $CH_2I_2$ via IPL light energy, a $CH_2I_2$ cell was prepared by subjecting the perovskite film to the IPL light energy and blocking the UV portion of the spectrum. The resulting cells exhibited large hysteresis with very low fill factor which indirectly indicates the incomplete bond cleavage or dissociation of iodine ions in the perovskite film In order to determine the optimal $CH_2I_2$ concentration and IPL process parameters for influencing halide vacancies, various concentrations of $CH_2I_2$ and a different number of IPL pulses were tested. As shown in FIG. 21A, three different concentrations of $CH_2I_2$ were tested, in particular 0.125, 0.25 and 0.375 ml $CH_2I_2$ per 1 ml DMF and 0.125 ml DMSO. Among these concentrations, 0.25 mL $CH_2I_2$ showed the highest efficiency and further increases in the concentration of the additive resulted in a decrease in the efficiency (see FIG. 21A). The preferred $CH_2I_2$ concentration of 0.25 mL might be introducing moderate excessive iodine ions to replenish the halide vacancies due to some sublimation and inherent vacancies formed during film formation. Concentrations above this preferred level might be creating excessive iodine rich conditions and causing a high density of traps. Interestingly, the J-V graphs in FIG. 21A and FIG. 21B show that the differentiation in performance is evident from the FF, whereas the $J_{SC}$ and $V_{OC}$ remain relatively stable. Further, the EIS and J-V characteristics confirm the higher recombination resistance and better efficiencies from $CH_2I_2$ cells compared to neat cells. The improved efficiencies are likely due to the improved management of the iodide ion vacancies in the films.

In addition to optimizing the $CH_2I_2$ concentrations, the role of IPL process on the film formation was also investigated by changing the number of pulses while holding the energy density constant. According to present embodiments, three different conditions were tested: no-IPL, 1 IPL pulse, and 5 IPL pulses. The results shown in FIG. 21B indicate that a single pulse is not sufficient to increase the performance of the device. However, 5 IPL pulses delivered sufficient energy to have a major impact on the performance of the solar cell. While not illustrated in FIG. 21B, increasing the number of IPL pulses to 10 produces a non-working device. Further investigation is warranted to fully understand the effect of the $CH_2I_2$ concentration and IPL conditions on the perovskite formation.

The results of Example 3 indicate that unlike traditional thermal sintering, the IPL process influences the crystal growth in a different way. The IPL process introduces very high temperatures (up to 700° C. to the film) and, depending on the input energy density given to the IPL source, the IPL dissipates the thermal energy on the milli-second time scale. During this spike in temperature, some of the MIA might sublimate from the film and could cause iodide poor conditions which lower the defect density. When an alkyl halide is added and alky ions are released by exposure to the IPL, the alkyl ions replenish the iodide vacancies and reduce the overall defect densities in the films. The EIS results discussed herein confirm the lower defect densities and the improved ionic conductivity of the alkyl halide films as compared to neat films. However, the synergy between $CH_2I_2$ and the IPL process in forming the perovskite films is a complex phenomenon and further investigation is warranted to fully understand the perovskite formation.

In summary, high efficiency perovskite solar cells were successfully fabricated by adding a light sensitive alkyl halide ($CH_2I_2$) as an additive to MAI and $PbI_2$ ink chemistry and annealing the films rapidly using IPL technique under ambient conditions. The alkyl halide additive perovskite cells exhibited pin hole free surface coverage after subjecting to IPL process, whereas the neat perovskite films exhibited incomplete coverage of the film. In addition, the concentration of the alkyl halide additive and the number of IPL pulses influenced the efficiency of the perovskite cells. The spectroscopy analysis discussed above also revealed a lower recombination rate for the alkyl halide perovskite cells. Accordingly, perovskite solar cells with efficiencies of up to 16.5% were produced with IPL processing. The IPL process according to current embodiments enables a much faster conclusion to the annealing step and this process can be done in ambient conditions without humidity control. It is anticipated that the IPL process according to present embodiments can anneal perovskite material at speeds of several square meters per second in ambient conditions.

All publications, patents, and patent applications mentioned in this specification are herein incorporated by reference to the same extent as if each individual publication, patent, or patent application was specifically and individually indicated to be incorporated by reference, including the references set forth in the following list:

REFERENCES

1. Kim, H.-S.; Lee, C.-R.; Im, J.-H.; Lee, K.-B.; Moehl, T.; Marchioro, A.; Moon, S.-J.; Humphry-Baker, R.; Yum, J.-H.; Moser, J. E.; Gratzel, M.; Park, N.-G., Lead Iodide Perovskite Sensitized All-Solid-State Submicron Thin Film Mesoscopic Solar Cell with Efficiency Exceeding 9%. *Sci. Rep.* 2012, 2, 591/1-591/7.
2. Noh, J. H.; Seok, S. I., Steps toward Efficient Inorganic-Organic Hybrid Perovskite Solar Cells. *MRS Bull.* 2015, 40 (8), 648-653.
3. Loi, M. A.; Hummelen, J. C., Hybrid Solar Cells—Perovskites Under the Sun. *Nat. Mater.* 2013, 12 (12), 1087-1089.
4. Eperon, G. E.; Stranks, S. D.; Menelaou, C.; Johnston, M. B.; Herz, L. M.; Snaith, H. J., Formamidinium Lead Trihalide: A Broadly Tunable Perovskite for Efficient Planar Heterojunction Solar Cells. *Energy Environ. Sci.* 2014, 7 (3), 982-988.
5. You, J.; Yang, Y.; Hong, Z.; Song, T.-B.; Meng, L.; Liu, Y.; Jiang, C.; Zhou, H.; Chang, W.-H.; Li, G.; Yang, Y., Moisture Assisted Perovskite Film Growth for High Performance Solar Cells. *Appl. Phys. Lett.* 2014, 105 (18), 183902/1-183902/5.
6. Burschka, J.; Pellet, N.; Moon, S.-J.; Humphry-Baker, R.; Gao, P.; Nazeeruddin, M. K.; Graetzel, M., Sequential Deposition as a Route to High-Performance Perovskite-Sensitized Solar Cells. *Nature* 2013, 499 (7458), 316-319.
7. Yantara, N.; Sabba, D.; Yanan, F.; Kadro, J. M.; Moehl, T.; Boix, P. P.; Mhaisalkar, S.; Gratzel, M.; Gratzel, C., Loading of Mesoporous Titania Films by $CH_3NH_3PbI_3$Perovskite, Single Step Vs. Sequential Deposition. *Chem. Commun.* 2015, 51 (22), 4603-4606.
8. Yacobi, B., *Semiconductor Materials: An Introduction to Basic Principles*. Springer Science & Business Media: 2003.
9. Panthani, M. G.; Kurley, J. M.; Crisp, R. W.; Dietz, T. C.; Ezzyat, T.; Luther, J. M.; Talapin, D. V., High Efficiency Solution Processed Sintered CdTe Nanocrystal Solar Cells: The Role of Interfaces. *Nano Lett.* 2014, 14 (2), 670-675.
10. Song, Z. N.; Watthage, S. C.; Phillips, A. B.; Tompkins, B. L.; Ellingson, R. J.; Heben, M. J., Impact of Processing Temperature and Composition on the Formation of Methylammonium Lead Iodide Perovskites. *Chem. of Mater.* 2015, 27 (13), 4612-4619.
11. Eperon, G. E.; Burlakov, V. M.; Docampo, P.; Goriely, A.; Snaith, H. J., Morphological Control for High Performance, Solution-Processed Planar Heterojunction Perovskite Solar Cells. *Adv. Func. Mater.* 2014, 24 (1), 151-157.
12. Zhou, Y.; Yang, M.; Wu, W.; Vasiliev, A. L.; Zhu, K.; Padture, N. P., Room-Temperature Crystallization of Hybrid-Perovskite Thin Films Via Solvent-Solvent Extraction for High-Performance Solar Cells. *J. Mater. Chem. A* 2015, 3 (15), 8178-8184.
13. Ahn, N.; Son, D.-Y.; Jang, I.-H.; Kang, S. M.; Choi, M.; Park, N.-G., Highly Reproducible Perovskite Solar Cells with Average Efficiency of 18.3% and Best Efficiency of 19.7% Fabricated Via Lewis Base Adduct of Lead(Ii) Iodide. *J. Am. Chem. Soc.* 2015, 137 (27), 8696-8699.
14. Abbel, R.; van Lammeren, T.; Hendriks, R.; Ploegmakers, J.; Rubingh, E. J.; Meinders, E. R.; Groen, W. A., Photonic Flash Sintering of Silver Nanoparticle Inks: A Fast and Convenient Method for the Preparation of Highly Conductive Structures on Foil. *MRS Commun.* 2012, 2 (4), 145-150.
15. Draper, G. L.; Dharmadasa, R.; Staats, M.; Lavery, B.; Druffel, T. L., Fabrication of Elemental Copper by Intense Pulsed Light Processing of a Copper Nitrate Hydroxide Ink. *ACS Appl. Mater. Interfaces* 2015, 7 (30), p. 16478-16485.
16. Carter, M.; Sears, J. W., Photonic Curing for Sintering of Nano-Particulate Material. *Adv. Powder Metall. Part. Mater.* 2007, 9/68-9/75.
17. Park, S.-H.; Kim, H.-S., Flash Light Sintering of Nickel Nanoparticles for Printed Electronics. *Thin Solid Films* 2014, 550, 575-581.
18. Perelaer, J.; Abbel, R.; Wuenscher, S.; Jani, R.; van Lammeren, T.; Schubert, U. S., Roll-to-Roll Compatible Sintering of Inkjet Printed Features by Photonic and Microwave Exposure. From Non-Conductive Ink to 40% Bulk Silver Conductivity in Less Than 15 Seconds. *Adv. Mater. (Weinheim, Ger.)* 2012, 24 (19), 2620-2625.
19. Stoumpos, C. C.; Malliakas, C. D.; Kanatzidis, M. G., Semiconducting Tin and Lead Iodide Perovskites with Organic Cations: Phase Transitions, High Mobilities, and near-Infrared Photoluminescent Properties. *Inorg. Chem.* 2013, 52 (15), 9019-9038.
20. Liang, P. W.; Liao, C. Y.; Chueh, C. C.; Zuo, F.; Williams, S. T.; Xin, X. K.; Lin, J. J.; Jen, A. K. Y., Additive Enhanced Crystallization of Solution-Processed Perovskite for Highly Efficient Planar-Heterojunction Solar Cells. *Adv. Mater.* 2014, 26 (22), 3748-3754.
21. Salim, T.; Sun, S.; Abe, Y.; Krishna, A.; Grimsdale, A. C.; Lam, Y. M., Perovskite-Based Solar Cells: Impact of Morphology and Device Architecture on Device Performance. *J. Mater. Chem. A* 2015, 3 (17), 8943-8969.
22. Dualeh, A.; Tétreault, N.; Moehl, T.; Gao, P.; Nazeeruddin, M. K.; Grätzel, M., Effect of Annealing Temperature on Film Morphology of Organic*-Inorganic Hybrid Pervoskite Solid-State Solar Cells. *Adv. Func. Mater.* 2014, 24 (21), 3250-3258.
23. Araki, T.; Sugahara, T.; Jiu, J.; Nagao, S.; Nogi, M.; Koga, H.; Uchida, H.; Shinozaki, K.; Suganuma, K., Cu Salt Ink Formulation for Printed Electronics Using Photonic Sintering. *Langmuir* 2013, 29 (35), 11192-11197.
24. Cui, H.-W.; Jiu, J.-T.; Nagao, S.; Sugahara, T.; Suganuma, K.; Uchida, H.; Schroder, K. A., Ultra-Fast Photonic Curing of Electrically Conductive Adhesives Fabricated from Vinyl Ester Resin and Silver Micro-Flakes for Printed Electronics. *RSC Adv.* 2014, 4 (31), 15914-15922.
25. Dharmadasa, R.; Lavery, B.; Dharmadasa, I. M.; Druffel, T., Intense Pulsed Light Treatment of Cadmium Telluride Nanoparticle-Based Thin Films. *ACS Appl. Mater. Interfaces* 2014, 6 (7), 5034-5040.
26. Dharmadasa, R.; Dharmadasa, I.; Druffel, T., Intense Pulsed Light Sintering of Electrodeposited CdS Thin Films. *Adv. Eng. Mater.* 2014, 16 (11), 1351-1361.
27. Singh, M.; Jiu, J.; Sugahara, T.; Suganuma, K., Photonic Sintering of Thin Film Prepared by Dodecylamine Capped $CuIn_xGa_1$—$XSe_2$ Nanoparticles for Printed Photovoltaics. *Thin Solid Films* 2014, 565, 11-18.

28. Dhage, S. R.; Hahn, H. T., Rapid Treatment of CIGS Particles by Intense Pulsed Light. *J. Phys. Chem. Solids* 2010, 71 (10), 1480-1483.
29. Dhage, S.; Kim, H.-S.; Hahn, H. T., Cu(In,Ga)Se2 Thin Film Preparation from a Cu(In,Ga) Metallic Alloy and Se Nanoparticles by an Intense Pulsed Light Technique. *J. Elec. Mater.* 2011, 40 (2), 122-126.
30. Niu, G.; Guo, X.; Wang, L., Review of Recent Progress in Chemical Stability of Perovskite Solar Cells. *J. Mater. Chem. A* 2015, 3 (17), 8970-8980.
31. Ito, S.; Tanaka, S.; Manabe, K.; Nishino, H., Effects of Surface Blocking Layer of $Sb_2S_3$ on Nanocrystalline $TiO_2$ for $CH_3NH_3PbI_3$ Perovskite Solar Cells. *J. Phys. Chem. C* 2014, 118 (30), 16995-17000.
32. Leyden, M. R.; Lee, M. V.; Raga, S. R.; Qi, Y., Large Formamidinium Lead Trihalide Perovskite Solar Cells Using Chemical Vapor Deposition with High Reproducibility and Tunable Chlorine Concentrations. *J. Mater. Chem. A* 2015, 3 (31), 16097-16103.
33. Saliba, M.; Tan, K. W.; Sai, H.; Moore, D. T.; Scott, T.; Zhang, W.; Estroff, L. A.; Wiesner, U.; Snaith, H. J., Influence of Thermal Processing Protocol Upon the Crystallization and Photovoltaic Performance of Organic-Inorganic Lead Trihalide Perovskites. *J. Phys. Chem. C* 2014, 118 (30), 17171-17177.
34. Pisoni, A.; Jaćimović, J.; Barišić, O. S.; Spina, M.; Gaál, R.; Forró, L.; Horváth, E., Ultra-Low Thermal Conductivity in Organic-Inorganic Hybrid Perovskite $CH_3NH_3PbI_3$. *J. Phys. Chem. Lett.* 2014, 5 (14), 2488-2492.
35. Leijtens, T.; Lauber, B.; Eperon, G. E.; Stranks, S. D.; Snaith, H. J., The Importance of Perovskite Pore Filling in Organometal Mixed Halide Sensitized $TiO_2$—Based Solar Cells. *J. Phys. Chem. Lett.* 2014, 5 (7), 1096-1102.
36. Xie, Y.; Shao, F.; Wang, Y.; Xu, T.; Wang, D.; Huang, F., Enhanced Performance of Perovskite $CH_3NH_3PbI_3$ Solar Cell by Using $CH_3NH_3I$ as Additive in Sequential Deposition. *ACS Appl. Mater. Interfaces* 2015, 7 (23), 12937-12942.
37. Nguyen, W. H.; Bailie, C. D.; Unger, E. L.; McGehee, M. D., Enhancing the Hole-Conductivity of Spiro-Ometad without Oxygen or Lithium Salts by Using $Spiro(TFSI)_2$ in Perovskite and Dye-Sensitized Solar Cells. *J. Amer. Chem. Soc.* 2014, 136 (31), 10996-11001.
38. Green M A 2016 Commercial progress and challenges for photovoltaics *Nature Energy* 1 15015.
39. Jean J, Brown P R, Jaffe R L, Buonassisi T and Bulović V 2015 Pathways for solar photovoltaics *Energy Environ. Sci.* 8 1200-19.
40. Park N-G 2015 Perovskite solar cells: an emerging photovoltaic technology *Materials Today* 18 65-72.
41. Yang W S, Noh J H, Jeon N J, Kim Y C, Ryu S, Seo J and Seok S I 2015 High-performance photovoltaic perovskite layers fabricated through intramolecular exchange *Science* 348 1234-7.
42. Seo J, Noh J H and Seok S I 2016 Rational Strategies for Efficient Perovskite Solar Cells *Accounts of Chemical Research* 49 562-72.
43. Hwang I, Jeong I, Lee J, Ko M J and Yong K 2015 Enhancing Stability of Perovskite Solar Cells to Moisture by the Facile Hydrophobic Passivation *ACS applied materials & interfaces* 7 17330-6.
44. Gao H, Bao C, Li F, Yu T, Yang J, Zhu W, Zhou X, Fu G and Zou Z 2015 Nucleation and Crystal Growth of Organic-Inorganic Lead Halide Perovskites under Different Relative Humidity *ACS applied materials & interfaces* 7 9110-7.
45. Eperon G E, Habisreutinger S N, Leijtens T, Bruijnaers B J, van Franeker J J, deQuilettes D W, Pathak S, Sutton R J, Grancini G and Ginger D S 2015 The importance of moisture in hybrid lead halide perovskite thin film fabrication *ACS nano* 9 9380-93.
46. Li D, Bretschneider S A, Bergmann V W, Hermes I M, Mars J, Klasen A, Lu H, Tremel W, Mezger M and Butt H-J r 2016 Humidity-Induced Grain Boundaries in MAPbI3 Perovskite Films *The Journal of Physical Chemistry C* 120 6363-8.
47. Pan J, Mu C, Li Q, Li W, Ma D and Xu D 2016 Room-Temperature, Hydrochloride-Assisted, One-Step Deposition for Highly Efficient and Air-Stable Perovskite Solar Cells *Advanced Materials* 28 8309-14.
48. Noh J H, Im S H, Heo J H, Mandal T N and Seok S I 2013 Chemical management for colorful, efficient, and stable inorganic-organic hybrid nanostructured solar cells *Nano letters* 13 1764-9.
49. Nagabhushana G P, Shivaramaiah R and Navrotsky A 2016 Direct calorimetric verification of thermodynamic instability of lead halide hybrid perovskites *Proc Natl Acad Sci USA* 113 7717-21.
50. Ding Y, Yao X, Zhang X, Wei C and Zhao Y 2014 Surfactant enhanced surface coverage of CH3NH3PbI3-xClx perovskite for highly efficient mesoscopic solar cells *Journal of Power Sources* 272 351-5.
51. Lavery B W, Kumari S, Konermann H, Draper G L, Spurgeon J and Druffel T 2016 Intense Pulsed Light Sintering of CH3NH3PbI3 Solar Cells *ACS applied materials & interfaces* 8 8419-26.
52. Troughton J, Carnie M J, Davies M L, Charbonneau C, Jewell E H, Worsley D A and Watson T M 2016 Photonic flash-annealing of lead halide perovskite solar cells in 1 ms *J. Mater. Chem. A* 4 3471-6.
53. Chung W H, Hwang H J, Lee S H and Kim H S 2013 In situ monitoring of a flash light sintering process using silver nano-ink for producing flexible electronics *Nanotechnology* 24 035202.
54. Dharmadasa R, Lavery B W, Dharmadasa I M and Druffel T 2015 Processing of CdTe thin films by intense pulsed light in the presence of CdCl2 *Journal of Coatings Technology and Research* 12 835-42.
55. Rebohle L, Prucnal S and Skorupa W 2016 A review of thermal processing in the subsecond range: semiconductors and beyond *Semiconductor Science and Technology* 31 103001.
56. Williams B A, Smeaton M A, Holgate C S, Trejo N D, Francis L F and Aydil E S 2016 Intense pulsed light annealing of copper zinc tin sulfide nanocrystal coatings *Journal of Vacuum Science & Technology A* 34 051204.
57. Nie W, Tsai H, Asadpour R, Blancon J-C, Neukirch A J, Gupta G, Crochet J J, Chhowalla M, Tretiak S and Alam M A 2015 High-efficiency solution-processed perovskite solar cells with millimeter-scale grains *Science* 347 522-5.
58. Stranks S D, Eperon G E, Grancini G, Menelaou C, Alcocer M J, Leijtens T, Herz L M, Petrozza A and Snaith H J 2013 Electron-hole diffusion lengths exceeding 1 micrometer in an organometal trihalide perovskite absorber *Science* 342 341-4.
59. Luo S and Daoud W A 2016 Crystal Structure Formation of CH3NH3PbI3-xClx Perovskite *Materials* 9 123.
60. Jeon N J, Noh J H, Kim Y C, Yang W S, Ryu S and Seok S I 2014 Solvent engineering for high-performance inorganic-organic hybrid perovskite solar cells *Nature materials* 13 897-903.

61. Jha M, Dharmadasa R, Draper G, Sherehiy A, Sumanasekera G, Amos D and Druffel T 2015 Solution phase synthesis and intense pulsed light sintering and reduction of a copper oxide ink with an encapsulating nickel oxide barrier *Nanotechnology* 26 175601.
62. Baikie T, Fang Y, Kadro J M, Schreyer M, Wei F, Mhaisalkar S G, Graetzel M and White T J 2013 Synthesis and crystal chemistry of the hybrid perovskite (CH 3 NH 3) PbI 3 for solid-state sensitised solar cell applications *Journal of Materials Chemistry A* 1 5628-41.
63. Kojima A, Teshima K, Shirai Y and Miyasaka T 2009 Organometal halide perovskites as visible-light sensitizers for photovoltaic cells *Journal of the American Chemical Society* 131 6050-1.
64. Onoda-Yamamuro N, Matsuo T and Suga H 1992 Dielectric Study of CH 3 NH 3 PbX 3 (X=Cl, Br, I) *Journal of Physics and Chemistry of Solids* 53 935-9.
65. Maculan G, Sheikh A D, Abdelhady A L, Saidaminov M I, Haque M A, Murali B, Alarousu E, Mohammed O F, Wu T and Bakr O M 2015 CH3NH3PbCl3 single crystals: inverse temperature crystallization and visible-blind UV-photodetector *The journal of physical chemistry letters* 6 3781-6.
66. Yantara N, Yanan F, Shi C, Dewi H A, Boix P P, Mhaisalkar S G and Mathews N 2015 Unravelling the effects of Cl addition in single step CH3NH3PbI3 perovskite solar cells *Chemistry of Materials* 27 2309-14.
67. Rosales B A, Men L, Cady S D, Hanrahan M P, Rossini A J and Vela J 2016 Persistent dopants and phase segregation in organolead mixed-halide perovskites *Chemistry of Materials* 28 6848-59.

Ankireddy, K.; Ghahremani, A.; Martin, B.; Gupta, G; Druffel, T, Rapid thermal annealing of CH3NH3PbI3 perovskite thin films by intense pulsed light with aid of diiodomethan additive, *J. Mater. Chem. A,* 2018, 6, 9378.

It will be understood that various details of the presently disclosed subject matter can be changed without departing from the scope of the subject matter disclosed herein. Furthermore, the foregoing description is for the purpose of illustration only, and not for the purpose of limitation.

What is claimed is:

1. A method of forming a perovskite thin film, comprising:
    depositing a perovskite layer onto a substrate, wherein the perovskite layer comprises a mixed halide perovskite formed from a perovskite precursor composition including an alkyl halide, and wherein the alkyl halide comprises 1 to 10 carbons, and
    cleaving the halide portion of the alkyl halide by exposing the perovskite layer to 1-10 pulses of intense pulsed light, the intense pulsed light having a wavelength of about 150 nm to about 1000 nm, an energy density of about 1 J/cm$^2$ to about 35 J/cm$^2$, and each pulse having a duration of about 1 microsecond to about 5 milliseconds;
    wherein the alkyl halide is chosen from the group diiodomethane, chloroiodomethane, and dichloromethane.

2. The method of claim 1, wherein a concentration of the alkyl halide comprises from about 0.125 ml per 1 ml of dimethylformamide and 0.125 ml dimethyl sulfoxide to about 0.375 ml per 1 ml of dimethylformamide and 0.125 ml dimethyl sulfoxide.

3. The method of claim 2, wherein the concentration of the alkyl halide comprises 0.25 ml alkyl halide per 1 ml of dimethylformamide and 0.125 ml dimethyl sulfoxide.

4. The method of claim 1, wherein the perovskite layer is an organometallic halide having the formula ABX$_3$, wherein A represents an organic group, B represents a metal, and X represents at least one halide.

5. The method of claim 4, wherein the metal is chosen from the group lead and tin.

6. A method of forming a perovskite thin film, comprising:
    depositing a perovskite layer onto a substrate, wherein the perovskite layer comprises a mixed halide perovskite formed from a perovskite precursor composition including an alkyl halide, and wherein the alkyl halide comprises 1 to 20 carbons and the halide is chosen from the group chlorine, bromine, and iodine, and
    cleaving the halide portion of the alkyl halide by exposing the perovskite layer to 1-10 pulses of intense pulsed light, the intense pulsed light having a wavelength of about 150 nm to about 1000 nm, an energy density of about 1 J/cm$^2$ to about 35 J/cm$^2$, and each pulse having a duration of about 1 microsecond to about 5 milliseconds;
    wherein the perovskite precursor composition further comprises dimethylformamide and dimethyl sulfoxide.

7. The method of claim 6, wherein a concentration of the alkyl halide comprises from about 0.125 ml per 1 ml of dimethylformamide and 0.125 ml dimethyl sulfoxide to about 0.375 ml per 1 ml of dimethylformamide and 0.125 ml dimethyl sulfoxide.

8. The method of claim 7, wherein the concentration of the alkyl halide comprises 0.25 ml alkyl halide per 1 ml of dimethylformamide and 0.125 ml dimethyl sulfoxide.

9. The method of claim 6, wherein the perovskite layer is an organometallic halide having the formula ABX$_3$, wherein A represents an organic group, B represents a metal, and X represents at least one halide.

10. The method of claim 9, wherein the metal is chosen from the group lead and tin.

* * * * *